United States Patent
Tang et al.

(10) Patent No.: US 7,257,794 B2
(45) Date of Patent: Aug. 14, 2007

(54) UNIT-BASED LAYOUT SYSTEM FOR PASSIVE IC DEVICES

(75) Inventors: Shyh-An Tang, Taichung (TW); Ya-Chin Hsu, Miaoli County (TW)

(73) Assignee: Springsoft, Inc., Hsinchu (TW)

( * ) Notice: Subject to any disclaimer, the term of this patent is extended or adjusted under 35 U.S.C. 154(b) by 260 days.

(21) Appl. No.: 11/039,751

(22) Filed: Jan. 19, 2005

(65) Prior Publication Data
US 2006/0136856 A1 Jun. 22, 2006

Related U.S. Application Data

(60) Provisional application No. 60/637,283, filed on Dec. 17, 2004.

(51) Int. Cl.
*G06F 17/50* (2006.01)
(52) U.S. Cl. .............................. 716/11; 716/10; 716/18
(58) Field of Classification Search .................... 716/8, 716/10, 11, 18
See application file for complete search history.

(56) References Cited
U.S. PATENT DOCUMENTS

| | | | |
|---|---|---|---|
| 5,394,338 A | 2/1995 | Shinohara et al. | |
| 6,321,367 B1 | 11/2001 | Chun et al. | |
| 6,370,677 B1 * | 4/2002 | Carruthers et al. | 716/8 |
| 6,457,163 B1 | 9/2002 | Yang et al. | |
| 6,804,809 B1 | 10/2004 | West et al. | |
| 6,851,094 B1 * | 2/2005 | Robertson et al. | 716/1 |

* cited by examiner

*Primary Examiner*—Thuan Do
(74) *Attorney, Agent, or Firm*—Daniel J. Bedell; Smith-Hill and Bedell

(57) ABSTRACT

A computer-aided design tool generates a layout for a passive device, such as a resistor or a capacitor, to be incorporated into an integrated circuit. The layout is based on a model describing the passive device as being formed by a variable number of interconnected instances of a device unit, such as a resistor segment or a capacitor block. User-supplied Input parameter values control the number of instances of the device unit included in the passive device layout, the relative positions of the device unit instances, and characteristics of their internal layouts. The tool also generates a display of a representation of the passive device layout and provides a graphical interface enabling the user to modify various aspects of the passive device layout by altering its displayed representation.

37 Claims, 20 Drawing Sheets

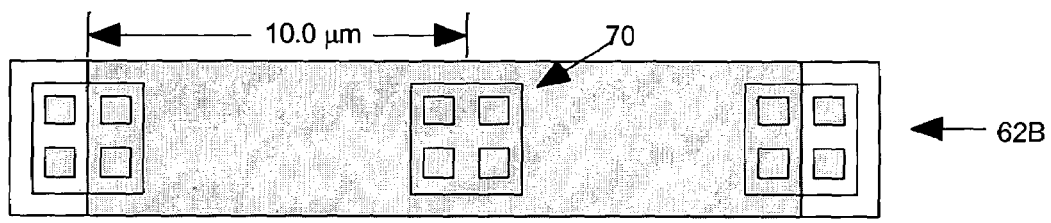
FIG. 17
FIG. 18
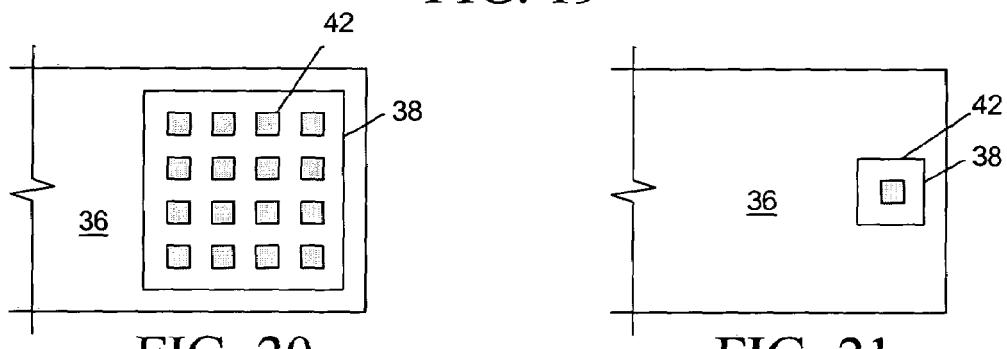
FIG. 19
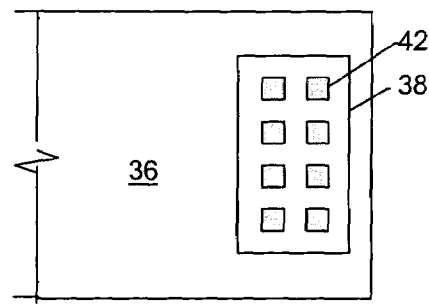
FIG. 20     FIG. 21
FIG. 22

| LENGTH | WIDTH | ALIGN | OFFSET | METAL OPTION |
|---|---|---|---|---|
| 10.0 | 7.0 | Left | 0.0 | |
| 28.0 | 7.0 | Right | 0.0 | |
←— 60
FIG. 27
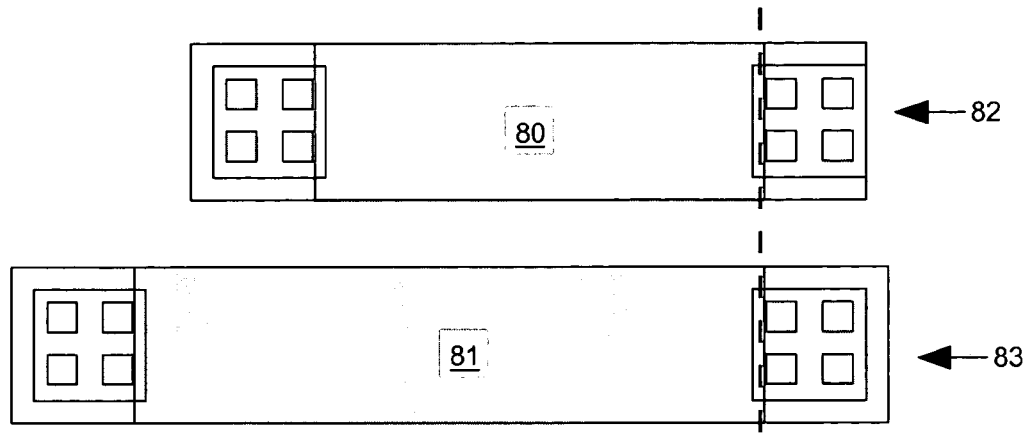
FIG. 28
| LENGTH | WIDTH | ALIGN | OFFSET | METAL OPTION |
|---|---|---|---|---|
| 20.0 | 7.0 | Left | 0.0 | |
| 28.0 | 7.0 | Left | 1.0 | |
←— 60
FIG. 29
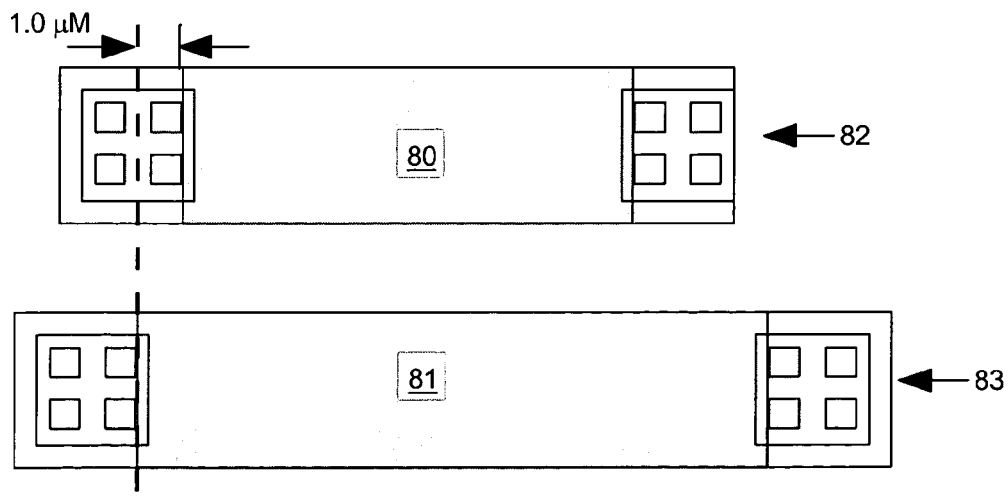
FIG. 30

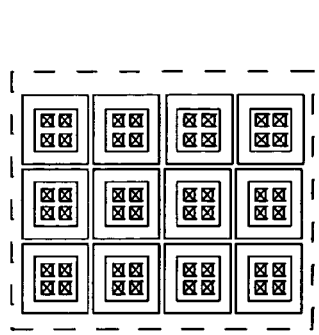
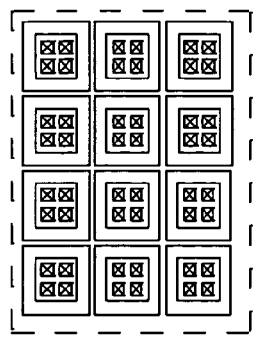
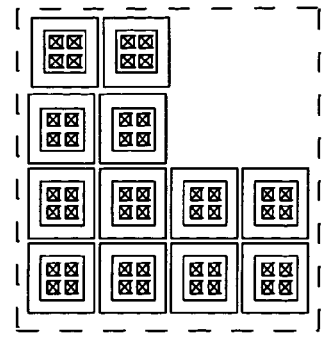
FIG. 80  FIG. 81  FIG. 82
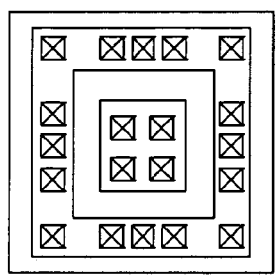
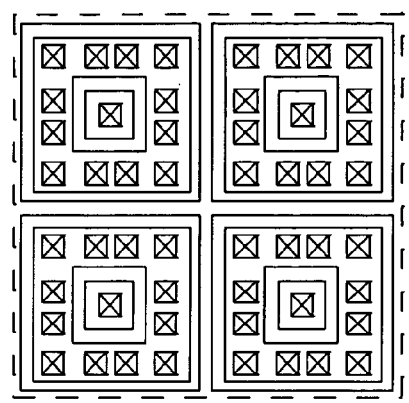
FIG. 83  FIG. 84
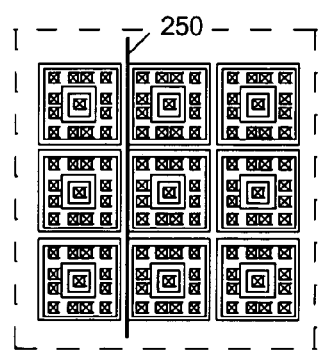
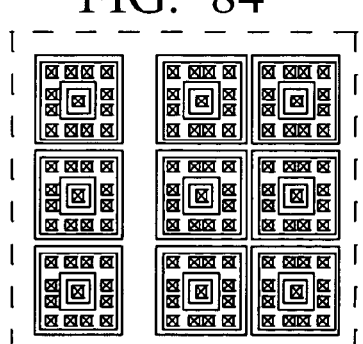
FIG. 85  FIG. 86
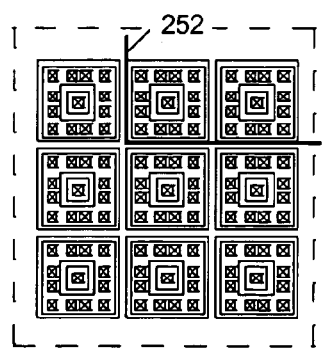
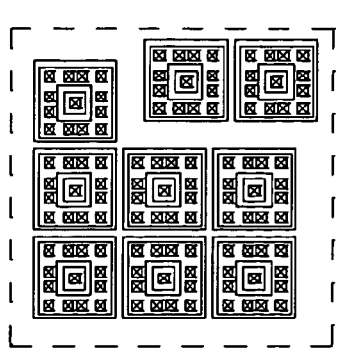
FIG. 87  FIG. 88

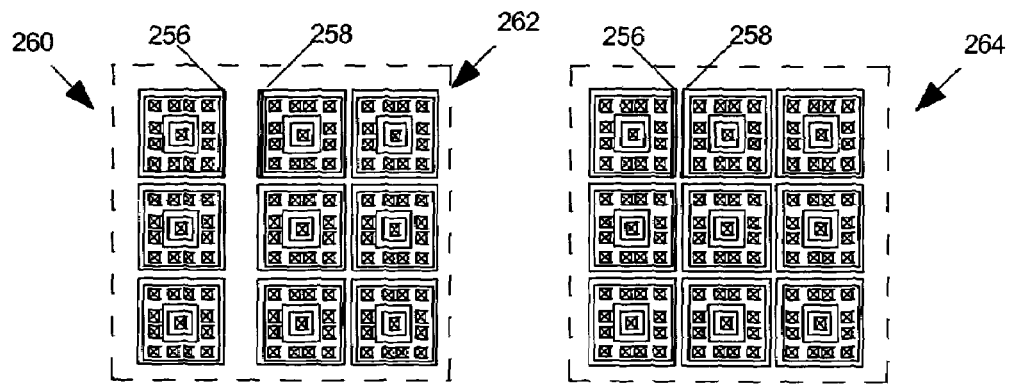
FIG. 89  FIG. 90
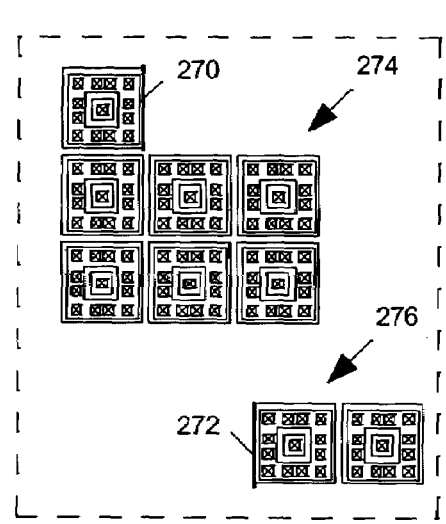 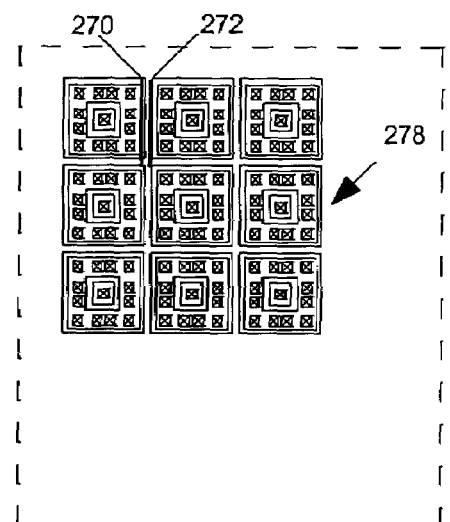
FIG. 91  FIG. 92
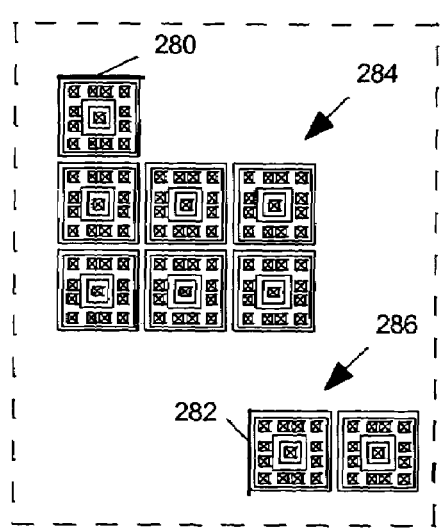 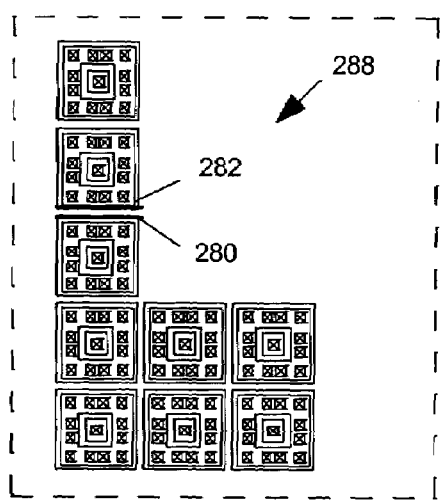
FIG. 93  FIG. 94

UNIT-BASED LAYOUT SYSTEM FOR PASSIVE IC DEVICES

CROSS-REFERENCE TO RELATED APPLICATION

This application claims benefit of U.S. Provisional Application No. 60/637,283 filed Dec. 17, 2004.

BACKGROUND OF THE INVENTION

1. Field of the Invention

The invention relates in general to systems for generating layouts for integrated circuit devices and in particular to a layout system having a graphical user interface enabling a user to create and modify passive devices within an IC layout.

2. Description of Related Art

A typical integrated circuit includes a semiconductor substrate doped in a desired pattern and several layers of insulating and conductive material sequentially formed above the substrate, each layer having a particular pattern of filled and empty areas. The doping patterns in the substrate and the layer patterns define structures of IC devices such as gates, transistors and passive devices (inductors, capacitors and resistors), along with the conductive networks ("nets") that interconnect the IC devices.

An IC designer typically produces an IC design in the form of a hardware description language (HDL) netlist, a computer file describing the IC at a relatively high level of abstraction, for example using Boolean expressions to describe IC logic. The designer then uses a syntheses tool to convert the HDL level netlist into a gate level netlist describing the IC as being formed by a set of interconnected instances of cells described by a cell library. Each cell is an IC component, such as for example a transistor, a gate or a higher-level component such as a memory, arithmetic logic unit, or central processing unit. The cell library includes an entry for each cell describing the internal layout of the cell including the substrate doping pattern and the layer patterns above the substrate needed to form the cell. After creating the gate level netlist, the designer employs computer-aided placement and routing (P&R) tools to generate an IC layout indicating the position of each cell instance with the layout and the routing of the nets between the cell instance terminals. The cell library provides the data defining the internal layout of each cell instance.

An IC designer normally does not have to directly specify the IC's doping and layer patterns except in cases where the IC is to include a component not described in a cell library. In such cases the IC designer can use a graphics program to draw the pattern for each layer forming the component. Designers often create passive devices such as resistors, capacitors and inductors this way. For example, as illustrated in FIG. 1 a resistor 10 can be nothing more than a rectangular section of a layer of resistive material 11 such as polysilicon with contacts 12 linking opposite ends of that rectangular section through vias 14 to nets formed on conductive layers above. The resistance of resistor 10 is a function of the length, width, thickness and resistivity of the material between its contacts 12. Although the thickness and resistivity of material 11 are fixed, an IC designer can control the resistance of the resistor by choosing its length and width. A designer can also modify the shape of a resistor as necessary to make it fit in some confined area of the layout. For example FIG. 2 shows a U-shaped resistor 16 that can have the same resistance as the straight resistor 10 of FIG. 1. An IC designer can form a capacitor from adjacent areas of two conductive layers separated by a dielectric layer, with the capacitance being a function of the shape and area of the conductive layers, and of the thickness and dielectric constant of the dielectric layer. A designer can form an inductor, for example, as a spiral of conductive material formed in one or more conductive layers of an IC.

Manually generating a layout for a passive component can be tedious and time-consuming, but automated layout systems allow a designer to write a macro procedure that can generate a passive device layout automatically. As illustrated in FIG. 3, a designer typically supplies various parameters defining characteristics of a passive device to the user-written macro procedures 20 on a graphical user interface (GUI) form 22, and the macro procedure then generates the passive device layout 24. For example, as illustrated in FIG. 4, data provided from the designer via a GUI form 26 specifies the resistor width (4.0 microns), the resistor value (200 Ohms) and the number (4) of resistor segments. When the designer presses the "Create" button 27, the macro procedure will generate an appropriately sized, 4-segment resistor 28.

Referring to FIG. 5, if the designer thereafter wishes to convert the 4-segment resistor 28 into a 2-segment resistor, the designer first selects resistor 28 in the layout so that the system will display GUI form 26 indicating its values. The designer then uses the form to alter the resistor value and number of segments, and the macro procedure then redraws the resistor as a two-segment resistor 29.

Since a passive device such as a resistor, capacitor or inductor can be of any of an infinite variety of shapes, they can be manually designed to fit into a wide variety of available spaces within an IC layout. But one difficulty with the prior art approach to automatically generate passive device layouts is that it requires the designer co write a separate macro procedure for each kind of shape. For example one, two, and four segment resistors require different macro procedures, though the procedures may allow for variation in dimensions. If the designer wants the layout tool to automatically generate a resistor having some shape for which a procedure is not available, the designer must create a new macro procedure for doing so, and that can be more time consuming that manually laying out the device. Thus it is often impractical for a designer to use automated procedures for creating passive device layouts when the space available for the passive device within an IC requires it to be of an unusual shape.

Various prior patents discuss method for automatically generating layouts for active device cells such as, for example, transistors and gates. U.S. Pat. No. 5,394,338 issued Feb. 28, 1995 to Shinohara et al describes a method of generating cell layouts for an IC based on models of the cells in which various dimensions of the cell are controlled by adjustable parameters.

U.S. Pat. No. 6,321,367 issued Nov. 20, 2001 describes a method for automatically generating a custom device layout including a step of specifying a device type and an associated set of device parameters. The device type is then matched to a selected cell in a cell library. Physical layout regions of the selected cell are then selectively modified in accordance with the device parameters. The physical layout regions may also be selectively modified in accordance with technology design rules in a design rule library. The physical layout regions of the selected cell are then drawn.

U.S. Pat. No. 6,457,163, issued Sep. 24, 2002 to Yang et al describes a method for generating an manipulating an IC layout for a multiple-gate semiconductor device, wherein the layout is comprised of a plurality of gate glue-blocks interconnected by a plurality of active-layer glue-blocks, working shapes of the gate glue-blocks are initially created according to user-defined gate glue-block parameters. Thereafter, working shapes of the active-layer glue-blocks are created in accordance with the working shapes of adjacent ones of the gate glue-blocks, in which the distances among the working shapes exceed minimum geometrical distances as defined by relevant design rules of an applied fabrication technology.

U.S. Pat. No. 6,804,809 issued Oct. 12, 2004 to West et al describes a method for creating a layout of a semiconductor device including first providing a plurality of partial-area layout cells and then generating the layout of the semiconductor device by placing the plurality of the partial-area layout cells together. The layout can be conveniently expanded to a desirable size by replicating or repeating certain repeatable cells.

What is needed is an IC layout system that can automatically generate passive devices layouts of a wide variety of shapes and other characteristics based on user input and which allows the user to easily adjust the layouts so that they fit within a variety of available spaces within an IC layout.

BRIEF SUMMARY OF THE INVENTION

A computer-aided design tool implements a method in accordance with the invention for generating a layout for a passive device, such as a resistor or a capacitor, to be incorporated into an integrated circuit. The layout is based on a model describing the passive device as being formed by a variable number of interconnected instances of a "device unit".

A model for a resistor layout describes the resistor as being formed by one or more instances of a resistor segment, a device unit including a body of resistive material and at least two contact structures on opposite ends of the body for providing signal paths from the resistive material to conductors on other layers of the IC for connecting the resistor segments to one another or to other components formed within the IC. The model describes the length of the body of each resistor segment, various characteristics of their internal layouts, and the relative positions of resistor segments within the resistor layout as being variable functions of user-supplied parameter values and of values of parameters derived from semiconductor design rules.

A model for a capacitor layout describes the capacitor as being formed by one or more capacitor blocks, wherein each capacitor block includes a first capacitive plate and a first contact structure for providing a signal path between the first capacitive plate and conductors on other layers of the IC for linking the first capacitive plates of all capacitor blocks to one another and to other components formed within the IC. The model also describes the capacitor layout as optionally including a second capacitive plate and a second contact structure for providing a signal path to conductors on another layer of the IC for linking the second capacitive plates of all capacitor blocks to one another and to one or more other components formed within the IC. The model describes the number of capacitor blocks to be included in a capacitor layout, the dimensions of the capacitor blocks, the relative positions of the capacitor blocks within the capacitor layout, and the determination as to whether the capacitor blocks are to include the second capacitive plate and contact structure, and other characteristics of the internal layout of the capacitor block instances as being variable functions of user-supplied parameter values and values of parameters derived from semiconductor design rules.

In carrying out the method in accordance with the invention, the tool also generates a display representing the passive device layout and provides a graphical interface enabling the user to modify various aspects of the passive device layout by altering its displayed representation, for example by altering positions of device units, altering characteristics of their internal layouts, splitting the layout of one passive device into layouts for two or more passive devices, or merging layouts of more than one passive device to form a layout for a single passive device.

By forming a passive device layout from instances of device units, the method of the present invention enables a user to easily and flexibly adjust the shape and other characteristics of a passive device layout by using the graphical interface to reposition the device unit instances or by altering characteristics of the device unit instances.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIGS. 17 and 18 are example views of the segment table of the GUI form of FIG. 15.

FIG. 19 is a plan view of an example segment layout,

FIGS. 20-22 are plan views of portions of resistor segments including various types of contact assemblies.

FIG. 27 is an example view of the segment table of the GUI form of FIG. 15.

FIG. 28 is a plan view of the layout of two segments described by the segment table of FIG. 27.

FIG. 29 is an example view of the segment table of the GUI form of FIG. 15.

FIG. 30 is a plan view of the layout of two segments described by the segment table of FIG. 29.

FIGS. 74-94 are plan views of example capacitor layouts generated by the device generator of FIG. 6.

DETAILED DESCRIPTION OF THE INVENTION

The present invention relates to computer software residing on computer-readable media, which when read and executed by a conventional computer, causes the computer to act as an IC layout system executing a method in accordance with the invention for generating and modifying layouts for user-specified passive devices. Suitable computer-readable media includes, but is not limited to, compact disks, floppy disks, hard disks, and computer memory. The computer suitably includes a monitor for displaying forms, menus and graphical representations of passive device layouts, and a keyboard and a mouse or other user input devices enabling the use to input data into the forms, to select menu items, and to select and interactively manipulate objects in the graphical display. While the drawings and specification describe at least one exemplary embodiment of the invention considered a best mode of practicing the invention, those of skill in the art will appreciate that the invention is not necessarily limited to including all of the features of the particular examples described below or to the manner in which they operate.

Figure 1:
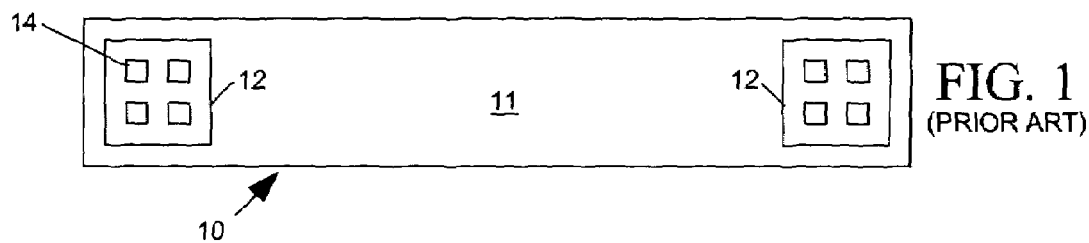
FIGS. 1 and 2 are plan views of prior art integrated circuit resistors.
Figure 2:
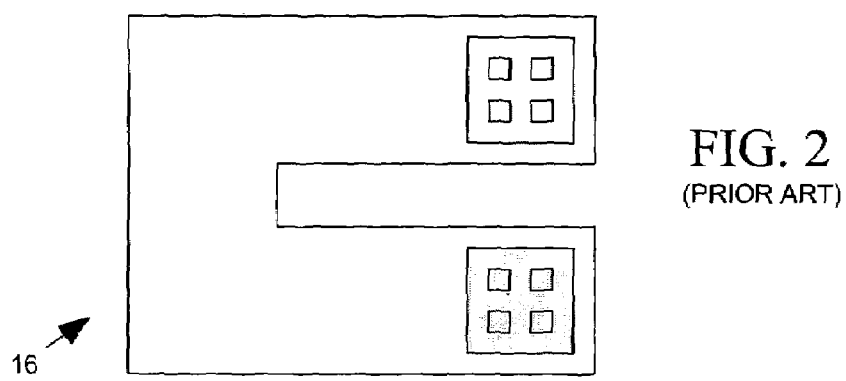
Figure 3:
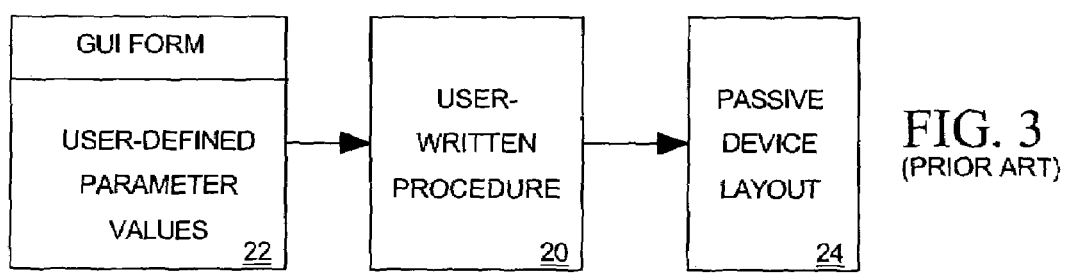
FIG. 3 is a data flow diagram illustrating a prior art system for generating a passive device layout.
Figure 4:
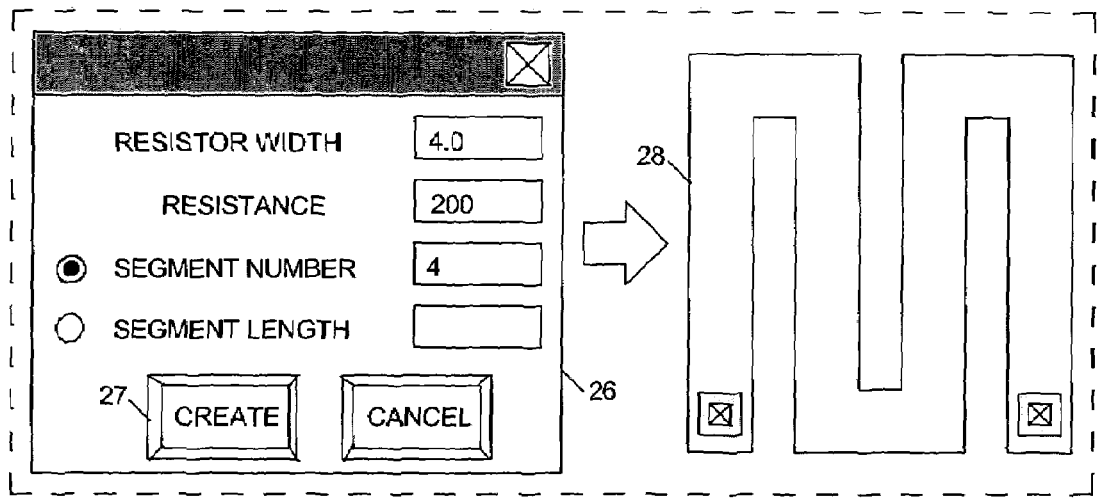
FIG. 4 illustrates an example GUI form employed in the prior art system of FIG. 3 along with a plan view of a prior art resistor specified by the GUI form.
Figure 5:
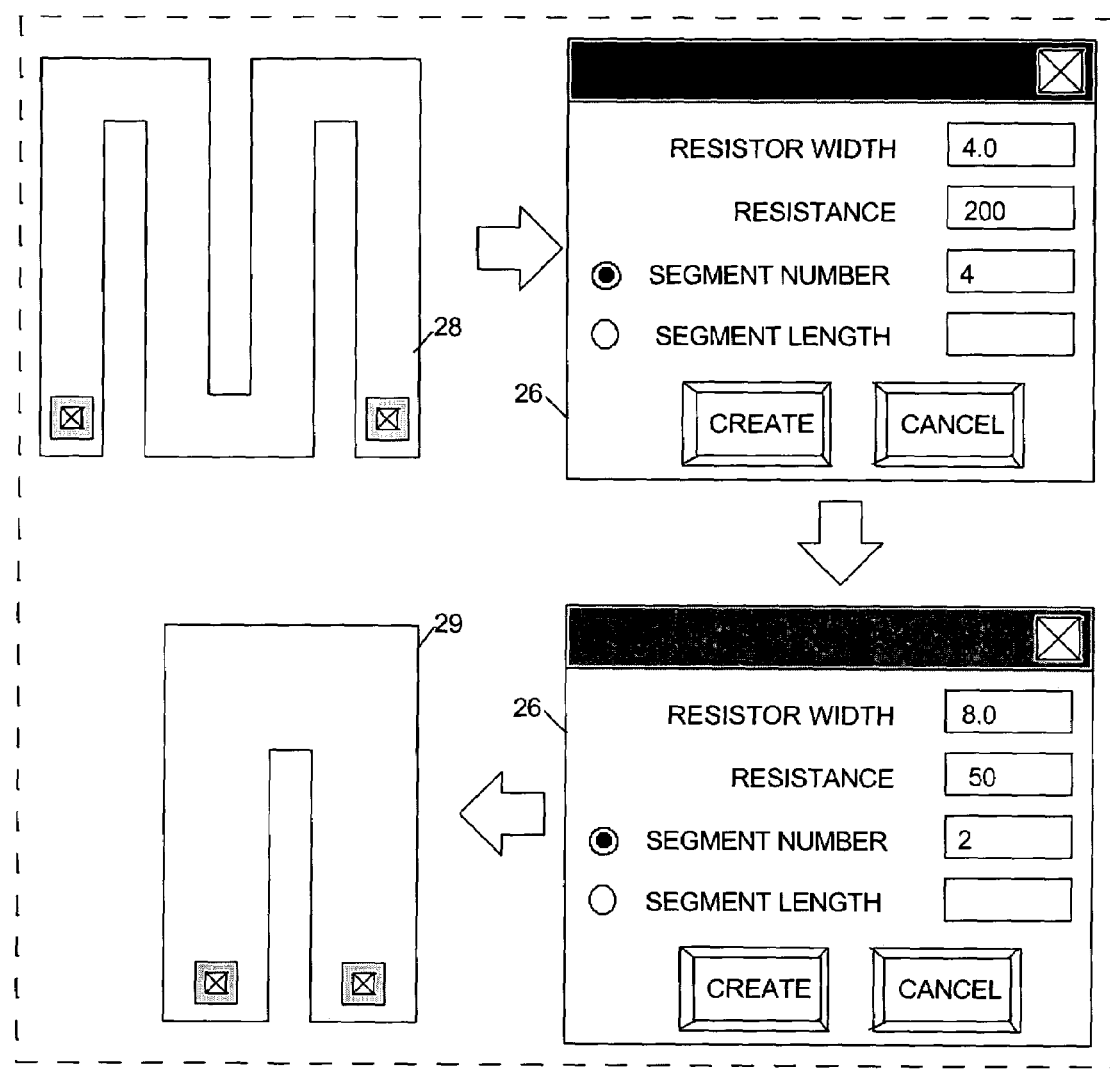
FIG. 5 illustrates steps in a process of modifying a resistor layout employing the prior art system of FIG. 3.

In addition to active devices such as transistors, an IC can include passive devices such as resistors, capacitors and inductors. For example, as illustrated in FIG. 1 a resistor 10 can be formed from a rectangular body of resistive material 11 on some layer of the IC with contact structures 12 including vias 14 for linking opposite ends of that rectangular body to nets formed on conductive layers of the IC. The nets link the resistor to other components within the IC. The resistance of resistor 10 is a function of the length, width, thickness and resistivity of the material 11 between its contacts 12. Although the thickness and resistivity of the body of material 11 are fixed, the designer can control the resistance of a resistor by adjusting its length and width. A designer can also modify the shape of a resistor as necessary to make it fit in some area of the layout. For example FIG. 2 shows a prior art U-shaped resistor 16 that can have the same resistance as the straight resistor 10 of FIG. 1.

An IC designer can generate a layout for a capacitor from adjacent areas of two conductive layers separated by a dielectric layer, with the capacitance being a function of the shape and area of the conductive layers, and of the thickness and dielectric constant of the dielectric layer. A designer can also, for example, form an inductor, for example, as a coil with turns formed on separate conductive layers of an IC interconnected by vias.

Passive Device Generator

Figure 6:
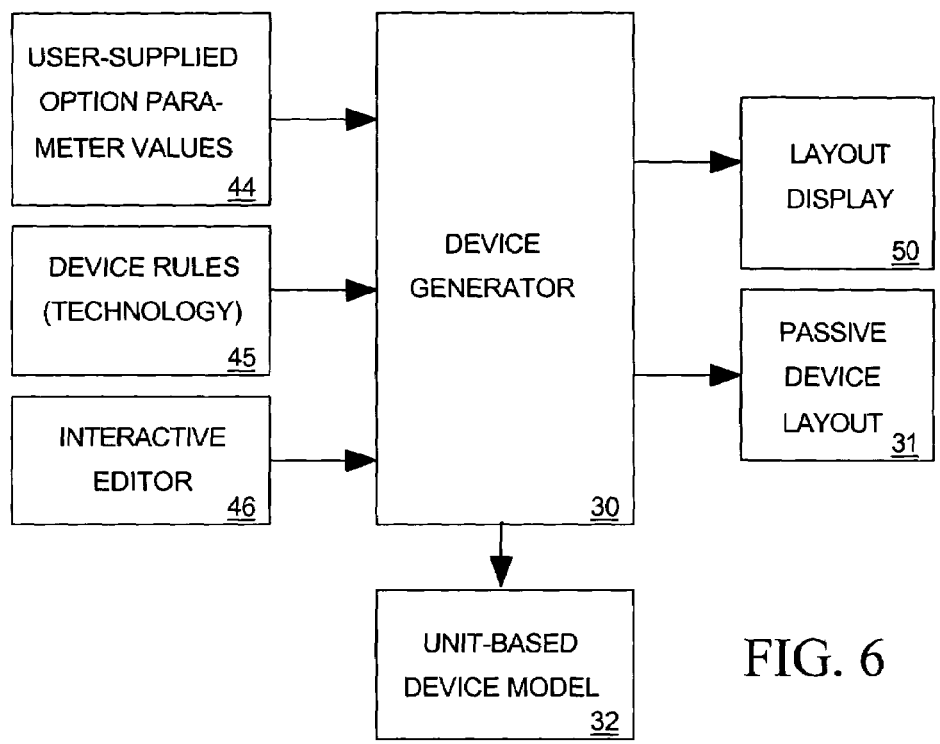
FIG. 6 illustrates an automated passive device layout system in accordance with the invention in block diagram form.

Referring to FIG. 6, the invention relates to a method implemented by a computer-aided design tool (device generator 30) for responding to input parameter values specifying characteristics of the passive device by generating a layout 31 for the passive device that can be incorporated into an IC layout. Device generator 30 receives as input, a "unit-based" device model 32 describing the passive device as an arrangement of instances of a "device unit". A device unit is a "unit passive device" in the sense that a passive device can consist of a single device unit, or can incorporate two or more interconnected device units. Device generator 30 therefore can create layouts for passive devices having various sizes and shapes from one or more device units.

Figure 7:
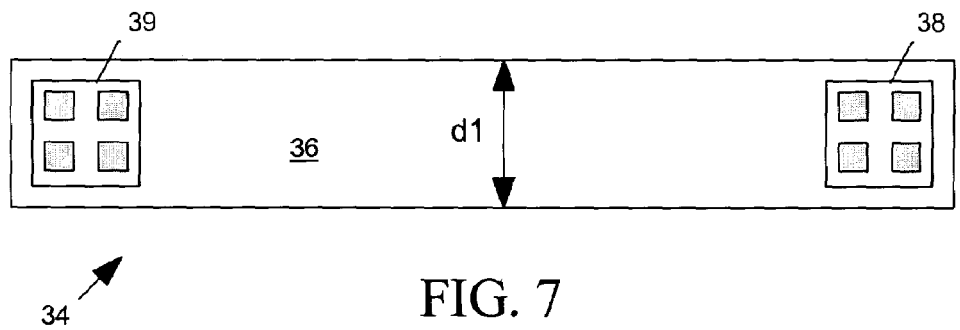
FIG. 7 is a plan view of an example resistor segment layout generated by the device generator of FIG. 6.
Figure 8:
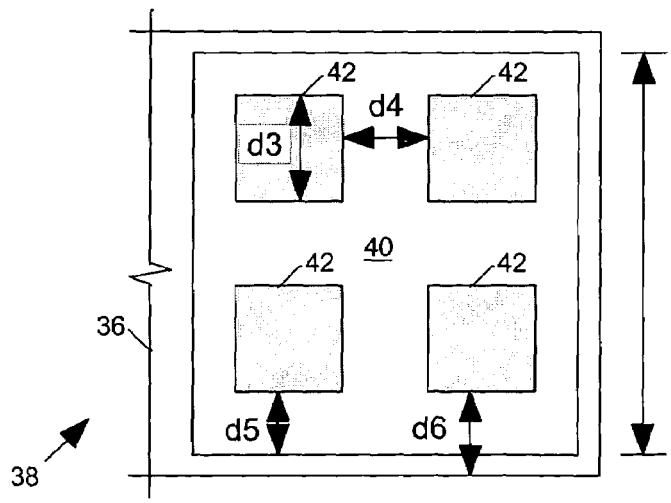
FIG. 8 is an enlarged plan view of one of the contact assemblies of FIG. 7.

For example, as illustrated in FIG. 7, a device model 32 for a resistor describes a resistor device unit (or "segment") 34 as including several objects formed within the IC including a straight body 36 of resistive material and two (or more) contact assemblies 38 and 39. FIG. 8 illustrates the layout of contact assembly 38 in more detail, including a metal pad 40 formed on another layer of the IC and contacts (vias) 42 extending vertically through the IC for connecting metal pad 40 to body 36. Other conductors and vias (not shown) can interconnect pad 40 to similar contact pads of other segments of the resistor or other components of the IC.

Device model 32 characterizes a resistor layout as including a variable number of instances of resistor segment 34 that can be arranged in an adjustable manner, and treats each resistor segment instance as having adjustable internal layout characteristics such as, for example, the number and relative positions of its contact structures, the layout of its contact structures, and the width and length of its body 36. Device generator 30 obtains the information it needs to determine how to select these variable layout characteristics from three information sources, user-supplied option parameters 44, a set of device rules, 45, and an interactive graphics editor 46.

Device generator 30 receives the user-supplied option parameter values 44 as input through a graphical user interface (GUI) form, and these parameter values specify various characteristics of the passive device that device generator 30 is to create. For a resistor, device parameter values 44 specify the number of segments to be included in the resistor, their relative positions, the resistance of the resistor (or, alternatively, the length of each segment), number of contacts in each contact assembly, as well as other characteristics as discussed below.

Unit-based device model 32 defines the dimensions and relative positions of objects forming a device unit as being variable functions of input parameter values. For example, for resistor segment 34 and its contact assemblies 38 (FIGS. 7 and 8) such variable functions can include, but need not be limited to, the following:

d1: body width,
d2: metal pad width,
d3: contact width,
d4: space between contacts,
d5: space between contact and metal pad edge, and
d6: space between contact and body enclosure.

Input parameter values can also control, for example, the spacing and alignment of the resistor segments. The user supplies some of the input parameter values 44 as a way of controlling many aspects of the device layout, but others of the input parameter values are functions of device rules associated with the IC technology used to implement the IC. An IC fabricator for each type of IC technology establishes a set of design rules 45 for specifying limits on various spacings and dimensions of objects formed in an IC, and the device generator 30 adjusts the values of the various layout parameters so that they are consistent with design rules 45.

Figure 9:
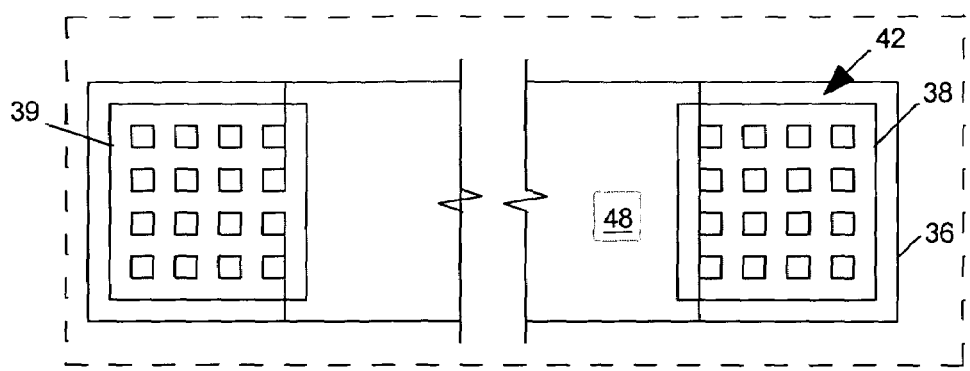
FIGS. 9-14 are alternative plan views of portions of example resistor segment layouts generated by the device generator of FIG. 6.
Figure 10:
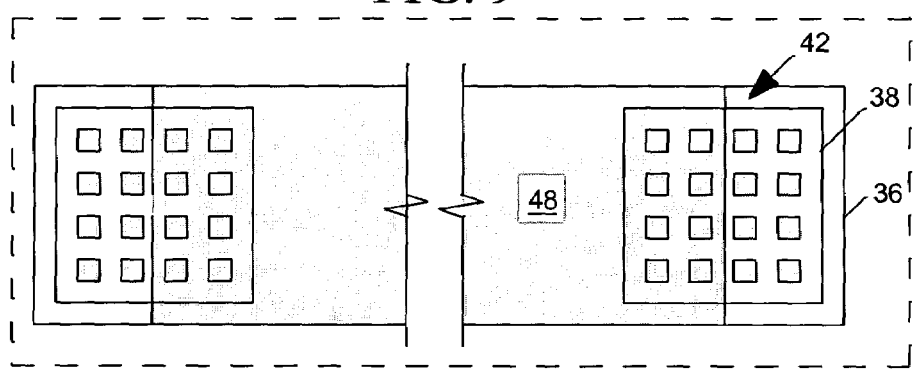
Figure 11:
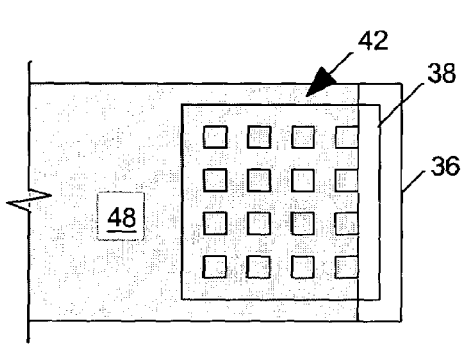
Figure 12:
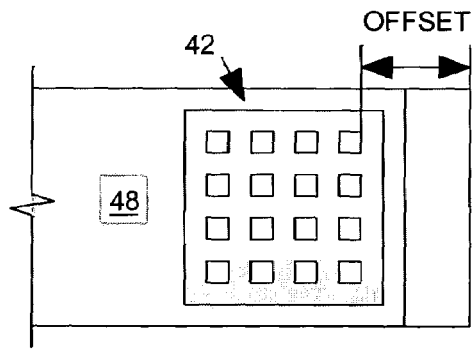
Figure 13:
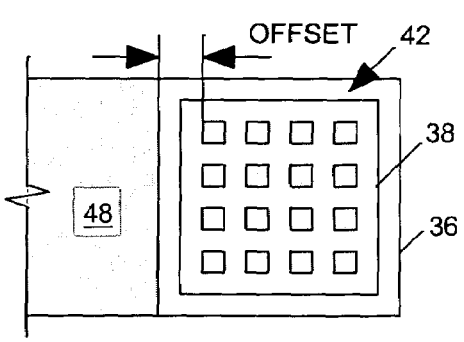
Figure 14:
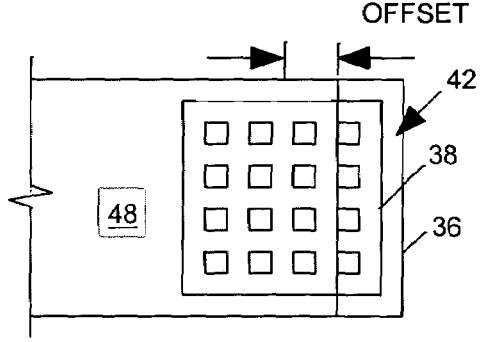

When generating a resistor layout, device generator 30 calculates the resistance of a resistor segment as a function of its "length", but the appropriate way to measure the length of a resistor depends on device technology and is therefore controlled by design rules 45 of FIG. 6. As illustrated in FIG. 9, unit-based device model 32 (FIG. 6) for a resistor treats a resistor segment as having a "virtual layer" 48. The virtual layer may not be a real layer of the IC, but device generator 30 treats the length of each resistor segment's virtual layer as the segment length for purposes of computing its resistance based on the dimensions and resistivity of the segment. Design rules 45 (FIG. 6) may, for example, specify that the right and left ends of virtual layer 48 align with the inner edges of the array of contacts 42 of right and left contact assemblies 38 and 39 as illustrated in FIG. 9, with the centers of the array of contacts 42 as illustrated in FIG. 10, or with the outer edges of the array contacts 42 as illustrated in FIG. 11. Design rules 45 may alternatively specify that the virtual layer ends align with a specified offset from the outer edges of contacts 42 as shown in FIG. 12, from the inner edges of contacts 42 as shown in FIG. 13, or from the center of the array of contacts 42 as shown in FIG. 14.

The unit-based device model 32, the user-supplied option parameter values 44, and the design rules 45 provide device generator 30 with all the information it needs to produce an initial passive device layout 31. Device generator 30 also generates a display 50 of a graphical representation of device layout 48 within the context of a representation of an IC layout, which may include layouts of other passive devices it has generated. As discussed below, a user viewing layout display 50 may thereafter employ interactive editor 46 to modify many characteristics of a passive device layout by interactively modifying its representation within display 50, for example by using a mouse to select a device unit and to change its shape or position.

Figure 15:
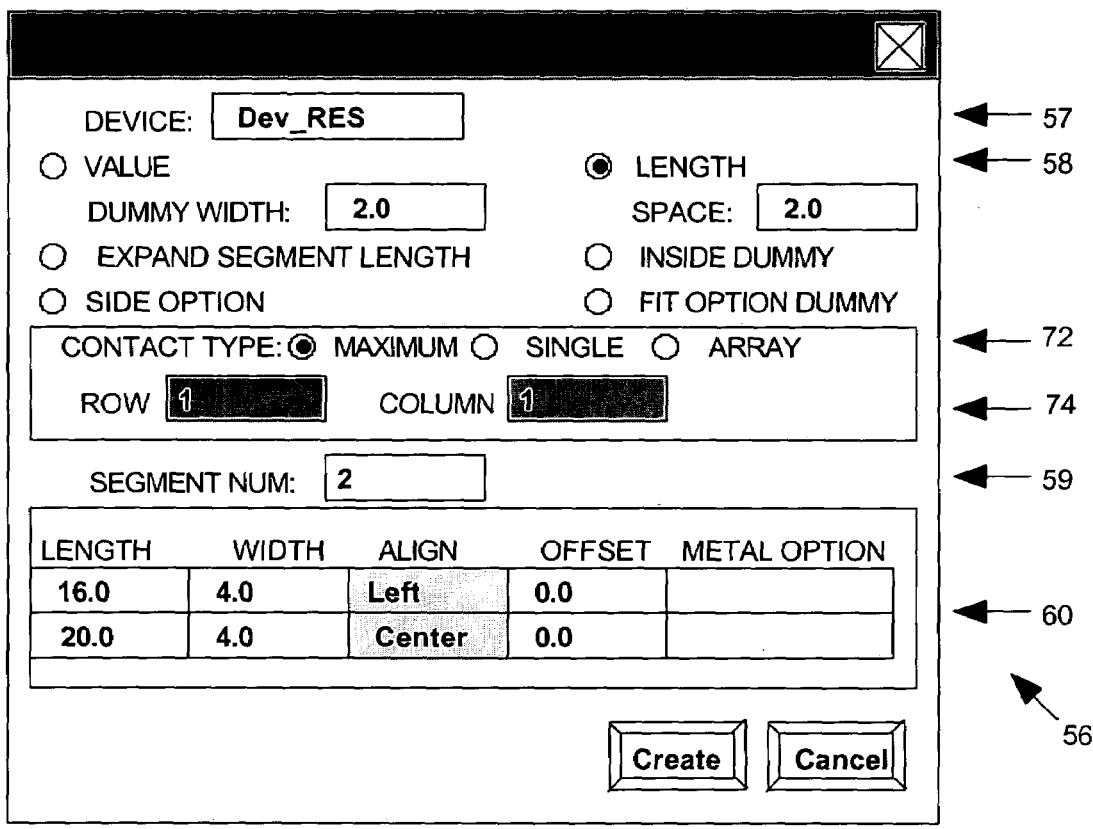
FIG. 15 depicts an example GUI form employed by the device generator of FIG. 6.

FIG. 15 illustrates a GUI form 56 for enabling a user to supply parameter values 44 of FIG. 6 for a resistor as input to device generator 30. The user enters a name for the resistor into text box 57. As mentioned above, a resistor can be formed from one or more resistor device units ("segments"), and since the resistor's resistance value is a function of the lengths of the resistor's segments, the user can choose to define the resistor's total resistance either by directly indicating the desired resistance of each resistor segment, or by indicating a desired length for each segment. If the user directly specifies resistance, device generator 30 calculates segment lengths, and if the user specifies segment lengths, the device generator calculates the resulting resistance of each segment. A pair of pushbuttons 58 in GUI form 56 enable the user to select whether the user is to specify the resistance value or length of each resistor segment.

Figure 16:
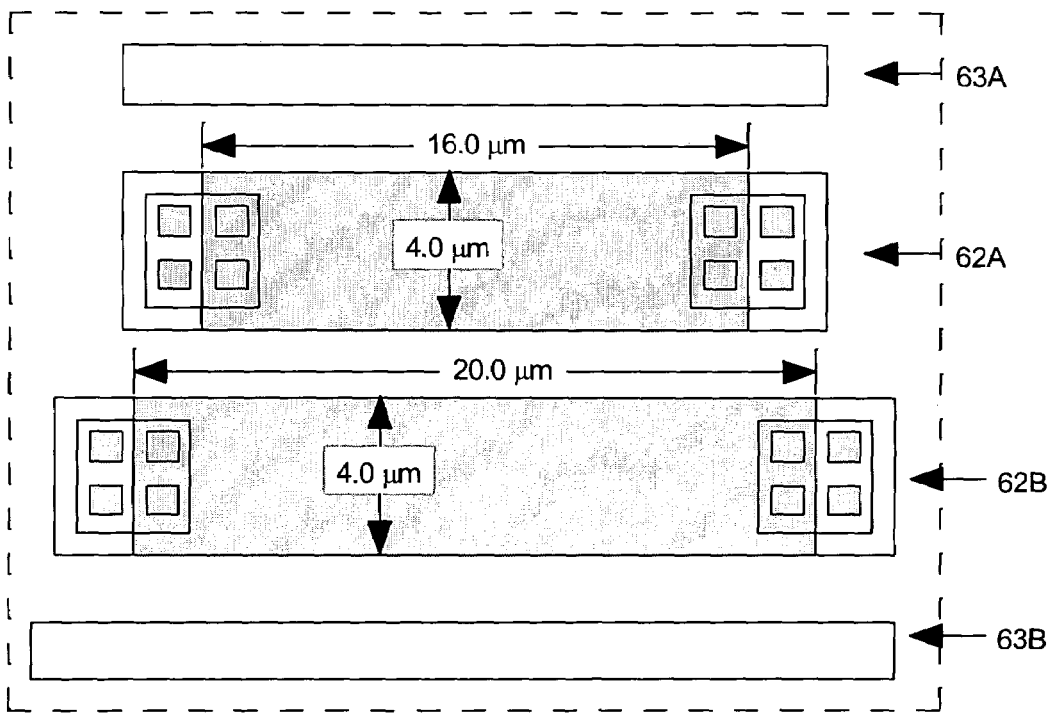
FIG. 16 is a plan view of an example resistor layout generated by the device generator of FIG. 6.

A text box 59 allows the user to specify the number of resistor segments, in this example, two. When the user enters a segment number into box 59, the device generator provides a table 60 including a separate row for each resistor segment to be included in the layout including a separate column for each parameter value it can separately specify for each segment. In the example of FIG. 15 the user has indicated by selecting the LENGTH pushbutton 58 that he or she wants to specify segment length (i.e. the length of its virtual layer), so table 60 includes a column of text boxes in which the user specifies a length (in microns) for the virtual layer of each resistor segment. Table 60 also includes a column of text boxes enabling a user to specify the body width of each resistor segment. FIG. 16 illustrates a resistor layout based on the parameter values supplied through GUI form 15 including a pair of 4-micron wide segments 62A and 62B and a pair of "dummies" 63A and 63B. Dummies 63A and 63B are strips of conductive material that are not linked to the resistor segments. They help shield the resistor from process variation.

If the user had selected the VALUE pushbutton instead of the LENGTH pushbutton in GUI form 56 of FIG. 15, table 60 would have included a column of text boxes as illustrated in FIG. 17 enabling the user to specify a resistance in Ohms for each segment rather than a length. In such case device generator 30 would calculate the segment lengths needed to provide the specified resistances given the user-supplied segment widths.

Table 60 of FIG. 15 also includes a column of text boxes enabling a user to specify a metal option, in microns, from the center of the left contact array 66 of the center of an optional contact assembly. For example, as illustrated in FIG. 18, when the user specifies a 10.0 micron metal option for segment 62B, device generator 30 includes the optional contact assembly 70 in that as shown in FIG. 19.

GUI form 56 of FIG. 15 also includes a set of three pushbuttons 72 allowing a user to select from among three options in the way the contact assemblies for the resistor segments are formed. When the user selects a "maximum" option, device generator 30 creates rectangular contact assemblies 38 as illustrated in FIG. 20 that include as many contacts 42 as possible given the specified width of the segment body and the design rules specifying minimum spacing between the contacts 42 and the edges of metal pad 40 and resistor body 36. Selecting a "single" option tells device generator 30 to produce a contact assembly 38 having only a single contact 42 as illustrated in FIG. 21. By selecting an "array" button of FIG. 15, the user tells GUI form 56 to enable input to a pair of text boxes 74 to allow the user to specify the number of rows and columns of contacts to be included in each contact assembly. FIG. 22 shows an example wherein the user has indicated the contact assembly 38 is to have four rows and two columns of contacts 42.

Figure 23:
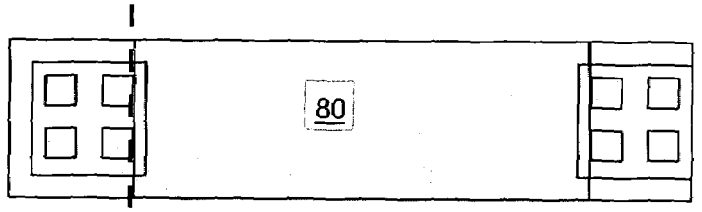
FIG. 23 is an example view of the segment table of the GUI form of FIG. 15.
Figure 24:
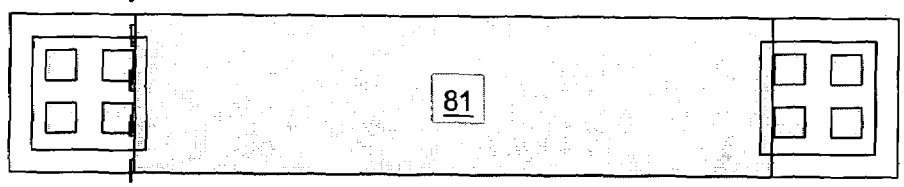
FIG. 24 is a plan view of the layout of two segments described by the segment table of FIG. 23.
Figure 25:
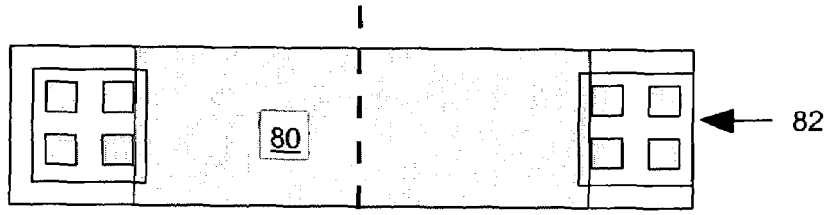
FIG. 25 is an example view of the segment table of the GUI form of FIG. 15.
Figure 26:
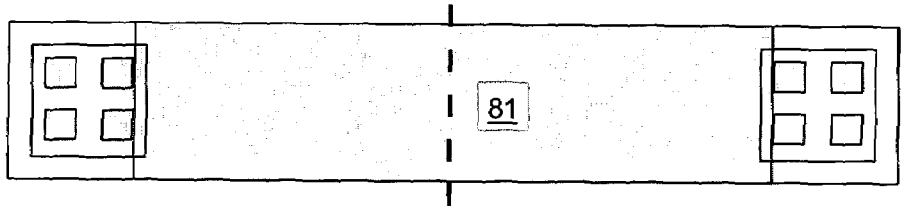
FIG. 26 is a plan view of the layout of two segments described by the segment table of FIG. 25.

As illustrated in FIG. 23, segment table 60 also includes a pair of text box columns labeled "ALIGN" and "OFFSET" enabling a user to specify how the segments defined by all rows of table 60 other than the top row are to align with the segment defined by the top row. The ALIGN and OFFSET text box column for the top row segment is disabled and the contents have no effect on alignment. The segments may be aligned according to the left, right or center of their virtual layers, and in the example table entry of FIG. 23, the user has specified that the left edges of the virtual layers 80 and 81 of first and second segments 82 and 83 of the resistor are to be aligned with zero offset, as illustrated in FIG. 24. In the example table entry of FIG. 25, the user has specified that the centers of the virtual layers 80 and 81 of the first and second segments 82 and 83 of the resistor are to be aligned with zero offset as shown in FIG. 26. In the example table entry of FIG. 27, the user has specified, as illustrated in FIG. 28, that the right edges of the virtual layers 80 and 81 of the first and second segments 82 and 83 of the resistor are to be aligned with zero offset. In the example table entry of FIG. 29, the user has specified, as illustrated in FIG. 30, that the left edges of the virtual layers 80 and 81 of the first and second segments 82 and 83 of the resistor are to be aligned with a one micron offset.

Figure 31:
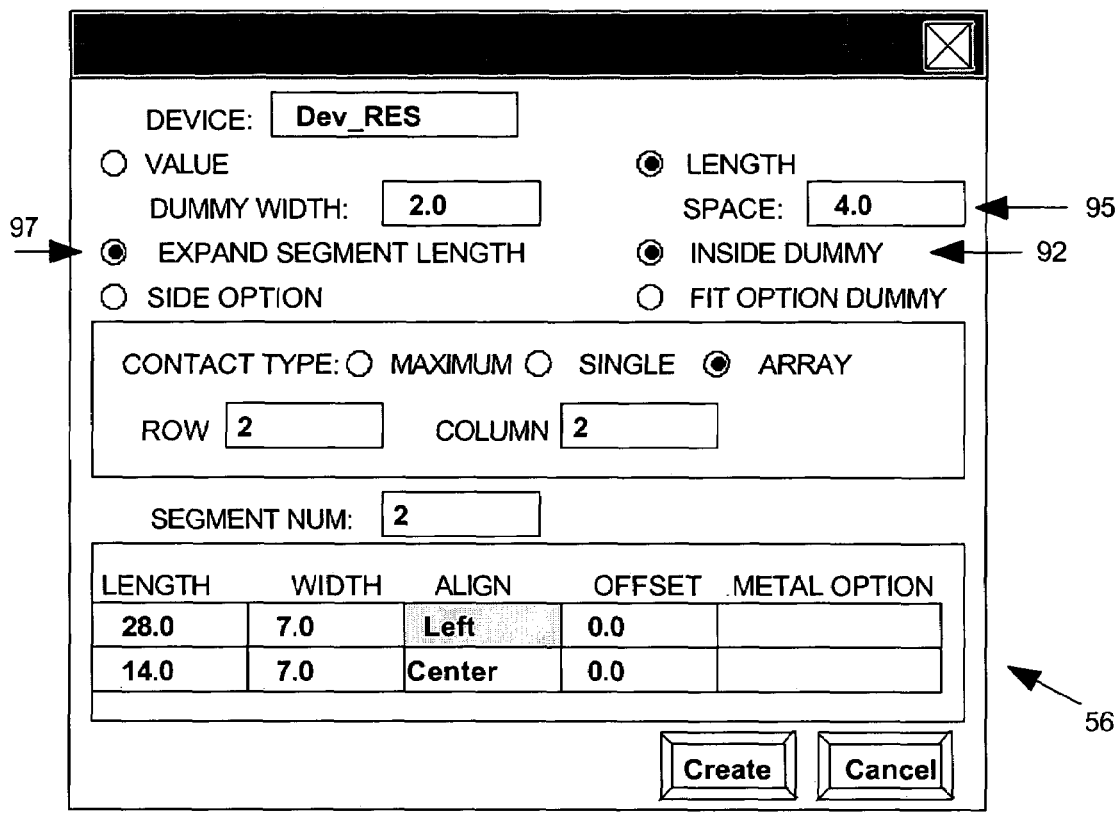
FIG. 31 is an example view of the GUI form of FIG. 6.
Figure 32:
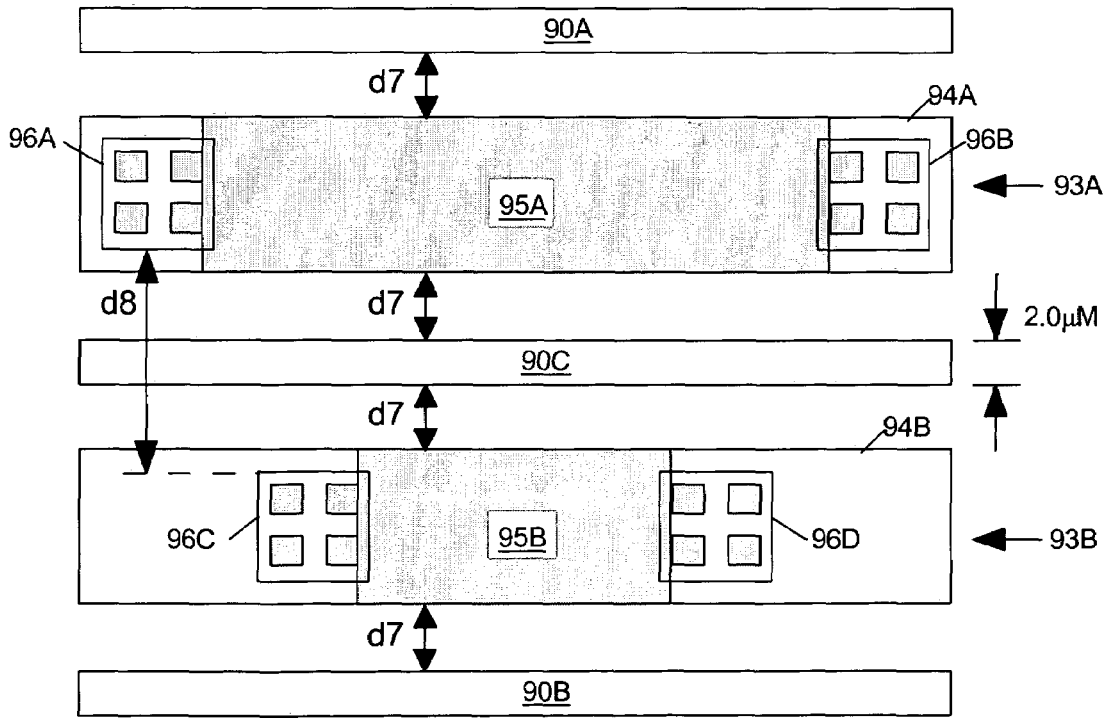
FIG. 32 is a plan view of a resistor layout specified by the GUI form of FIG. 31.

Referring to FIG. 31, a button 92 on GUI form 56 allows the user to specify that the resistor is to include an "inside" dummy between each adjacent pair of resistor segments. For example, the two-segment resistor layout of FIG. 32 specified by the GUI form of FIG. 31, not only includes outside dummies 90A and 90B forming the top and bottom sides of the resistor, it also includes an inside dummy 90C resides between adjacent segments 93A and 93B. If the user does not select the inside dummy option, the resistor will include the outside dummies, but will not include dummies between resistor segments. Resistor model uses a parameter d7 to control the spacing between dummies and contact assemblies, and the user enters a desired value of this parameter into a text box 95 as shown in FIG. 31. Since the spacing d8 between segments is subject to a minimum limit imposed by a design rule, device generator 30 will warn the user when the dummy spacing and width violates that design rule.

An "expand segment length" button 97 on form 56 of FIG. 31 enables the user to select whether the material forming the body of all segments will be of uniform length. For example since the specified virtual layer lengths for segments 93A and 93B of FIG. 32 differ, the lengths of their bodies 94A and 94B would differ if the expand segment length button were not selected, because device generator 30 would adjust the body lengths to accommodate the specified lengths of their virtual layers 95A and 95B, the widths of their contact assemblies 96A-96D, and the necessary spacings between contact assembles and body edges. But when, as illustrated in FIG. 31, the user selects the expand segment length button 97, device generator 30 will make the lengths of the bodies of all segments and the lengths of all dummies equal and coextensive. Since segment 93A of FIG. 32 has the longest virtual layer, device generator 30 makes the body of segment 93B, and dummies 90A, 90B, 90C the same length as the body of segment 93A.

Figure 33:
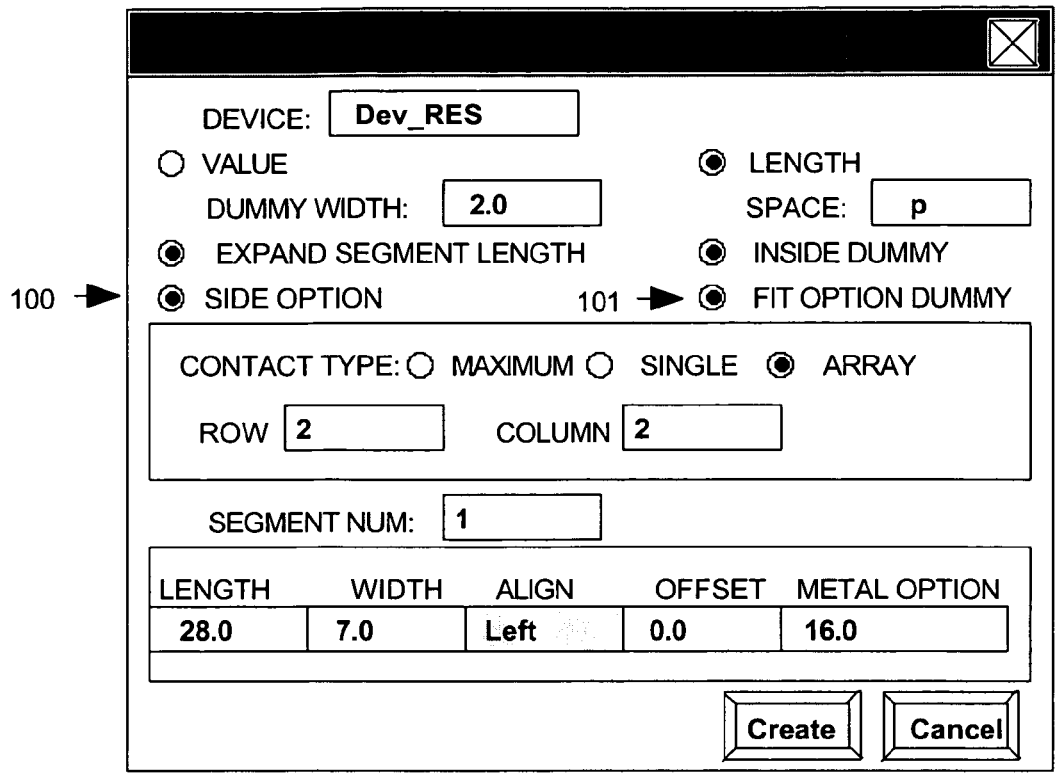
FIG. 33 is an example view of the GUI form of FIG. 6.
Figure 34:
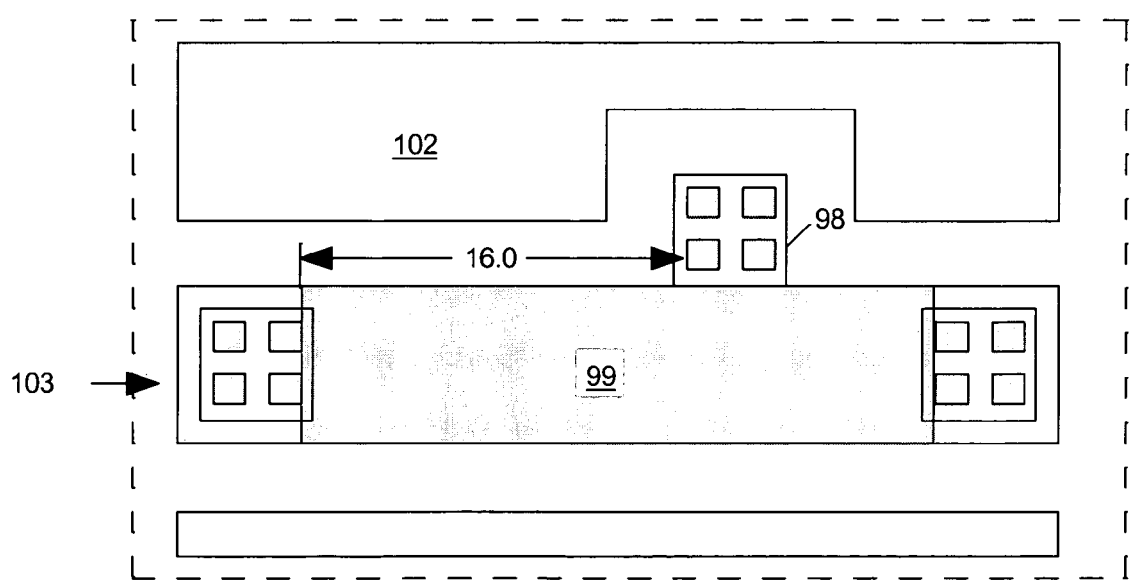
FIG. 34 is a plan view of a resistor layout specified by the GUI form of FIG. 33.
Figure 35:
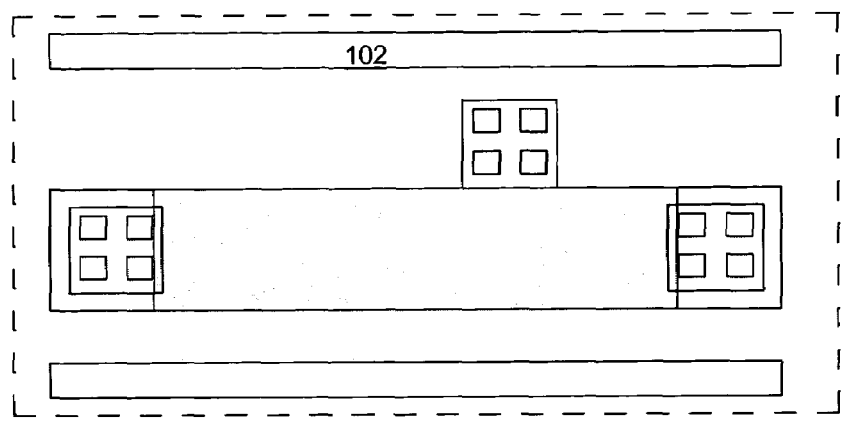
FIG. 35 is a plan view of a resistor layout that can be generated by the device generator of FIG. 6

FIG. 33 shows a GUI form used to specify a resistor layout shown in FIG. 34. Here the user has indicated that the single resistor segment is to include an optional contact assembly 98 positioned with an offset of 16 microns from the left edge of virtual layer 99, and by selecting a "side option" button 100 indicating that contact 98 assembly is to reside at the side of the segment's body rather than on it as, for example, does contact array 70 of FIG. 19. In GUI form 56 of FIG. 33, the user has also selected a "fit option dummy" button 101 indicating that the dummy 102 next to contact array 98 is to be made wide enough and notched as necessary to fit around contact array 98 while retaining the user-specified 2.0 micron minimum dummy width and the 2.0 micron dummy spacing between resistor segment 103 and dummy 102 throughout the length of the resistor segment 99. If the user had not selected the fit option dummy button, the resistor layout would appear as shown in FIG. 35 where dummy 102 has uniform user-specified width.

Interactive Editor

Figure 36:
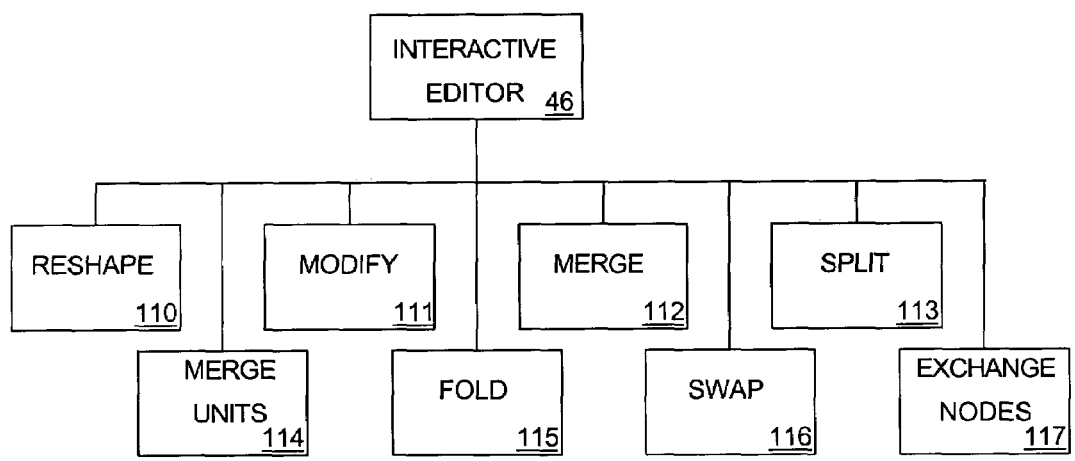
FIG. 36 is a block diagram illustrating the various functions that can be carried out by the interactive editor 46 of FIG. 6.

After the user has filled out the GUI form specifying the values of the optional parameters for a resistor layout, and device generator 30 of FIG. 6 has generated the passive device layout 31 and incorporated a representation of the passive device layout into a display 50 of an IC layout, the user can use the interactive editor 46 to change the values of various option parameters controlling the device layout. FIG. 36 is a block diagram illustrating the various layout editing functions 110-117 the interactive editor 46 enables a user to carry out relative to a resistor layout.

Reshape

Figure 37:
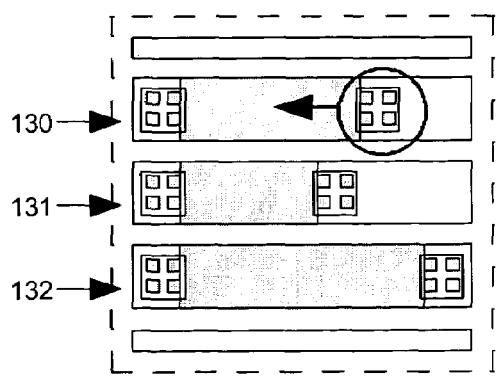
FIGS. 37-60 are plan views of resistor layouts that can be generated by the device generator of FIG. 6.
Figure 38:
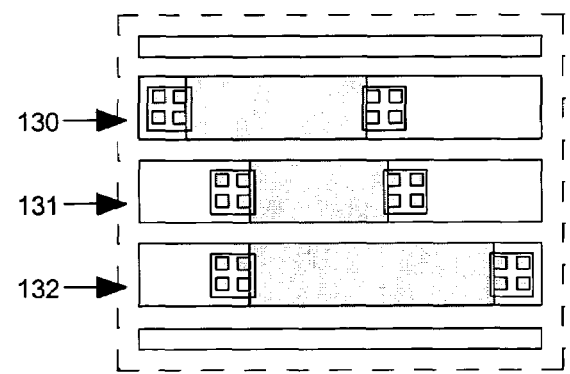
Figure 39:
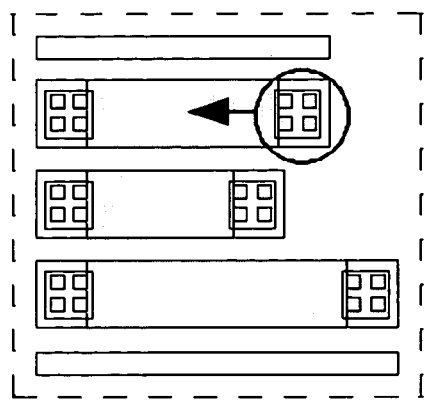
Figure 40:
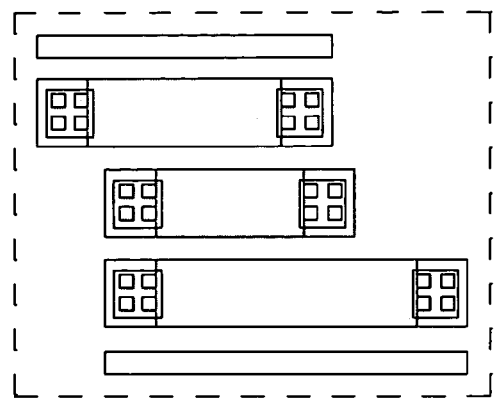

The reshape function 110 of FIG. 36 allows a user to modify resistor segment alignment by moving one segment relative to the others. For example, FIG. 37 shows a display of a resistor layout including three segments 130-132. When a user wants to change the alignment of the top segment 130 relative to the two lower segments 131 and 132, the user employs a mouse click and drag operation to select a contact assembly 134 on segment 130 and to drag it, to the left. FIG. 38 shows the resulting layout in which segment 130 now resides more to the left of segments 131 and 132. In this example, the user has selected the "extend segment length" option so that the device generator 30 will make the resistor segment bodies and the dummies all have similar lengths. Note that, as shown in FIGS. 37 and 38, by pushing segment 130 to the left and reducing the overlap of segments 130-132, the user caused the device generator to extend the lengths of all resistor bodies. FIG. 39 and 40 show the layout of a resistor before and after a similar reshape operation in an example where the user has not selected the extend segment length option. Note that the segment body and dummy lengths are not affected by the reshape operation.

Modify

Figure 41:
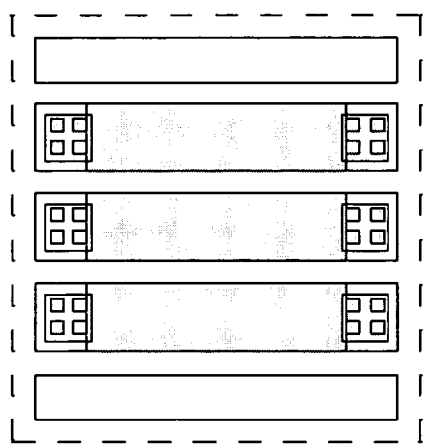
Figure 42:
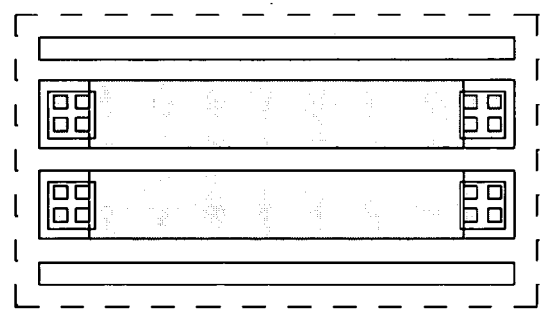
Figure 43:
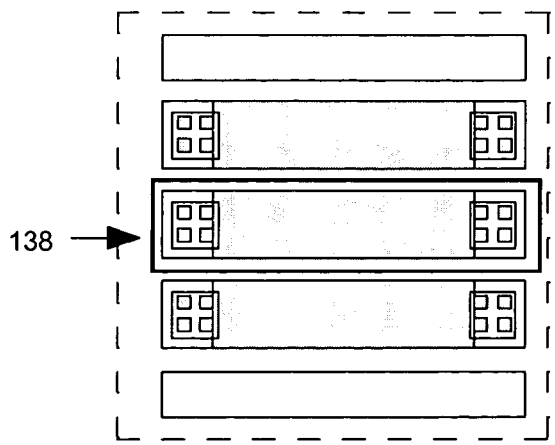
Figure 44:
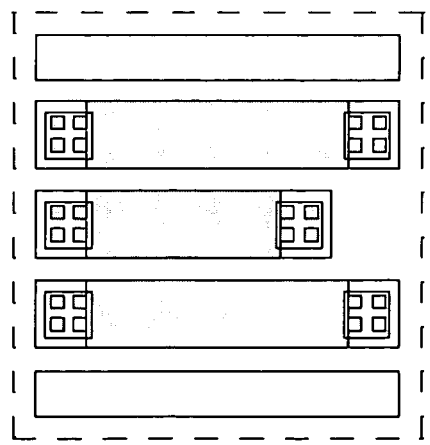

The modify function 111 of FIG. 36 can enable a user to modify various features of a resistor using the GUI interface form controlling its option parameter values. The user may invoke the modify function 111 by selecting a device resistor in the display and then choosing a modify command from a mouse menu displayed by interactive editor. The device generator responds to the modify command by displaying the GUI form for that device, allowing the user to modify any user-supplied parameter values for that device. For example FIGS. 41 and 42 show a resistor layout before and after the user has used a modify command to change the option parameter data in the GUI form to reduce the number of segments from three to two and to reduce the specified dummy width. When the user uses a mouse click to select a particular segment of a displayed resistor, the device generator will display the GUI form with the table entry for that segment highlighted. For example, FIG. 43 shows a resistor layout where the user has selected a particular resistor segment 138. After invoking the modify command, the user modifies the GUI form table entry for segment 138 to specify it as being shorter, and the device generator will redraw the segment as shown in FIG. 44.

Merge Device Units

Figure 45:
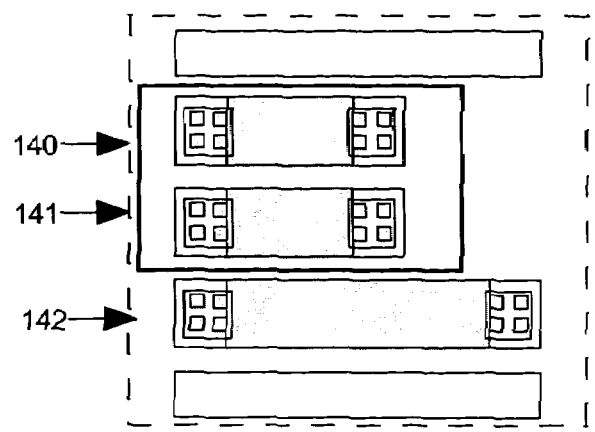
Figure 46:
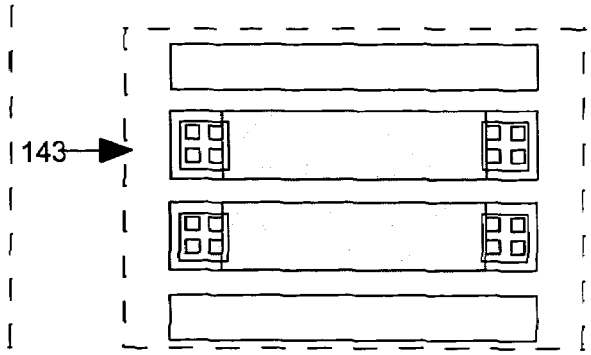

The merge function 114 of FIG. 36 allows a user to replace two resistor segments with one having a resistance equivalent to that of the two resistor segments connected either in series or parallel. In the example of FIG. 45, a resistor originally has three segments 140, 141 and 142. The user can perform a serial merge on segments 140 and 141, by using a mouse to select the two segments, and then using a mouse menu to invoke a "serial merge" command. The device generator will then respond to the command by merging segments 140-141 to form a new segment 143 as illustrated in FIG. 46 having a virtual layer length equal to the sum of the virtual layer lengths of segments 140 and 141, and having a resistance that is the sum of resistances of segments 140 and 141.

Figure 47:
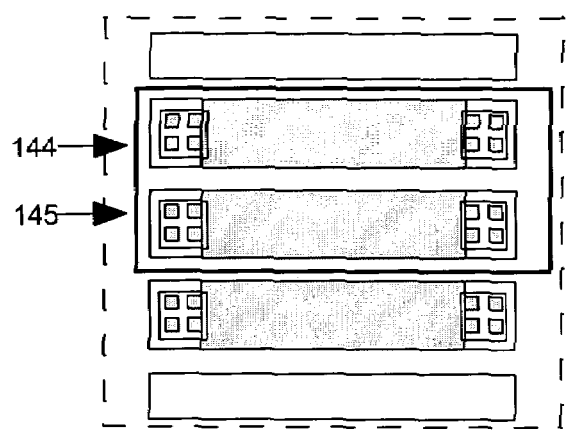
Figure 48:
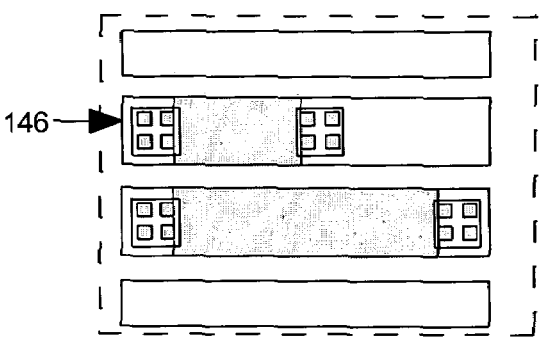

FIGS. 47 and 48 illustrate a parallel merge operation. Here the user has selected two resistor segments 144 and 145 as illustrated in FIG. 47 and has then selected a "parallel merge" command from a mouse menu. The device generator then produces a new layout for the resistor as illustrated in FIG. 48 wherein segments 144 and 145 are merged to form a segment 146 having a resistance equal to the resistance of segments 144 and 145 if they had been connected in parallel. In this example, since resistors 144 and 145 have the same length and resistance, resistor 146 will be half as long as resistors 144 and 145 and will have half their resistance.

Fold

Figure 49:
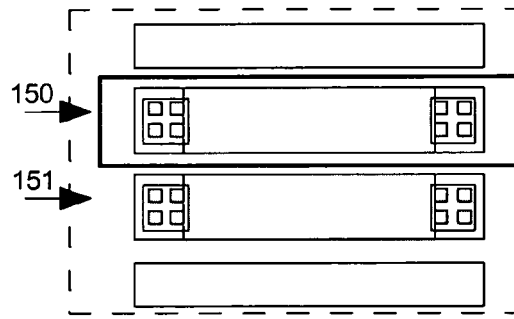
Figure 50:
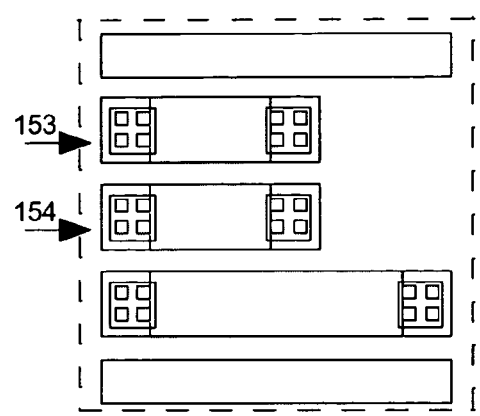

The fold function 115 of FIG. 36 allows a user to create two resistor segments from one. In the example of FIG. 49, a resistor originally has two segments 150 and 151. The user can perform a serial fold on segment 150 by using a mouse to select that segment, and then using a mouse menu to invoke a "serial fold" command. The device generator responds to the command by replacing segment 150 with two new segments 153 and 154 as illustrated in FIG. 50, each having a resistance equal to one half that of segment 150.

Figure 51:
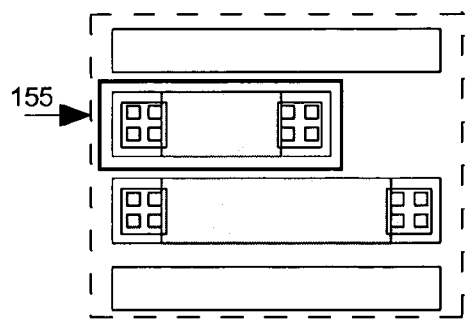
Figure 52:
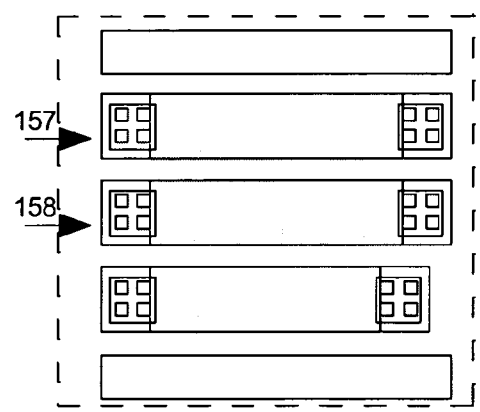

FIGS. 51 and 52 illustrate a parallel fold operation. Where the user has selected a resistor segment 155 as illustrated in FIG. 51 and then selected a "parallel fold" command from a mouse menu. The device generator then produces a new layout for the resistor as illustrated in FIG. 52 wherein segment 155 is replaced with two segments 157 and 158, each having a resistance twice that of segment 155.

Split

Figure 53:
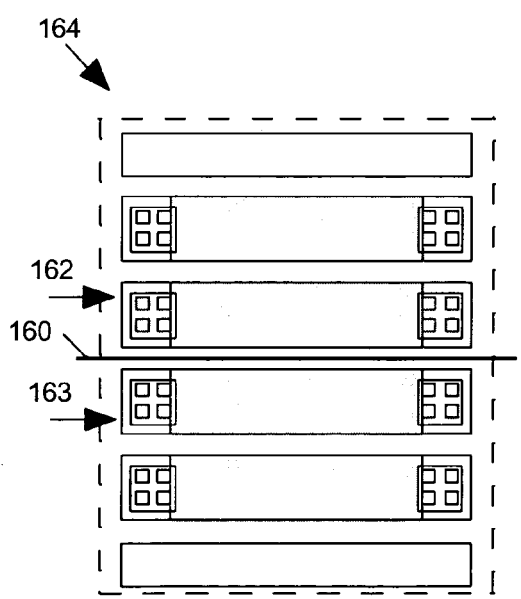
Figure 54:
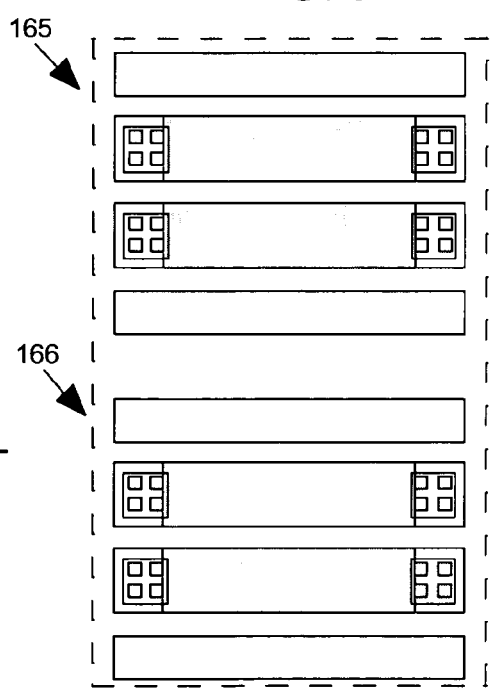

FIGS. 53 and 54 illustrate the split function 113 of FIG. 36 allowing a user to split one resistor into two. After using a mouse to draw a line 160 between two segments 162 and 163 of a single resistor 164 as illustrated in FIG. 53, the user selects a "split" command from a mouse menu causing the device editor to replace resistor 164 with two new resistors 165 and 166 as illustrated in FIG. 54 wherein resistor 165 includes all of the segments above line 160 and resistor 166 includes all of the segments below line 160. The user can draw the line between any two resistor segments.

Merge Resistors

Figure 55:
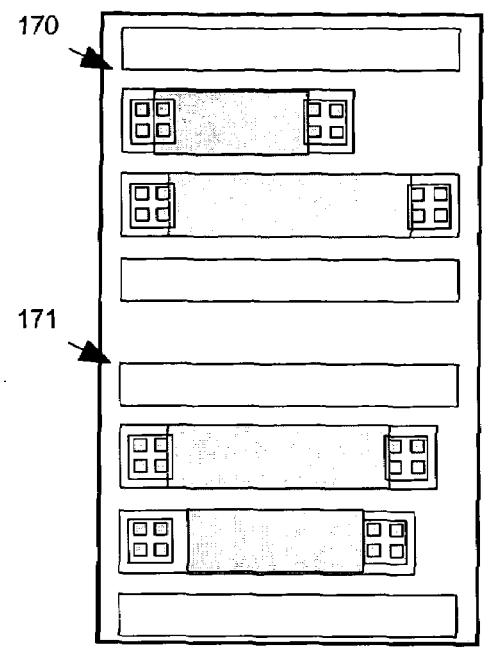
Figure 56:
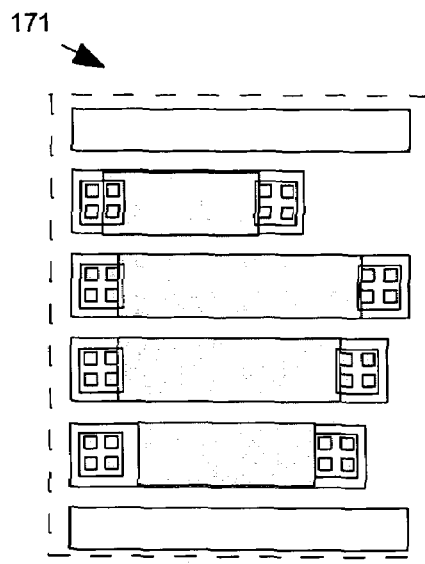

FIGS. 55 and 56 illustrate the merge resistor function 112 of FIG. 36 allowing a user to combine two resistors appearing in a layout into one. As illustrated in FIG. 55, the user selects two resistors 170 and 171 and then selects a "merge resistors" command from a mouse menu telling the device editor to replace resistors 170 and 171 with the resistor 172 illustrated in FIG. 56 incorporating the segments of both resistor 170 and 171.

Figure 57:
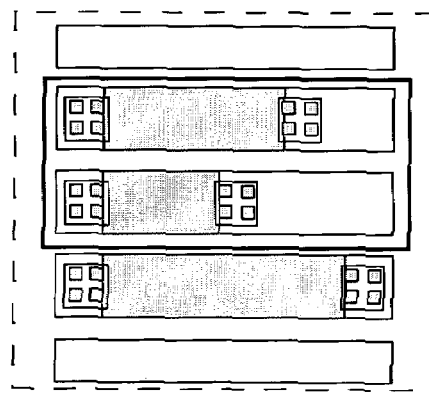
Figure 58:
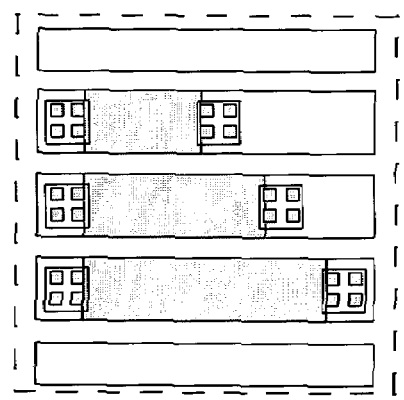

FIGS. 57 and 58 illustrate the swap resistor function 116 of FIG. 36 allowing a user to swap positions of two resistor segments appearing in a layout. As illustrated in FIG. 57, the user selects two resistor segments 173 and 174 and then selects a "swap resistor segments" command from a mouse menu telling the device editor to swap positions of resistor segments 173 and 174 as illustrated in FIG. 58.

Exchange Nodes

Figure 59:
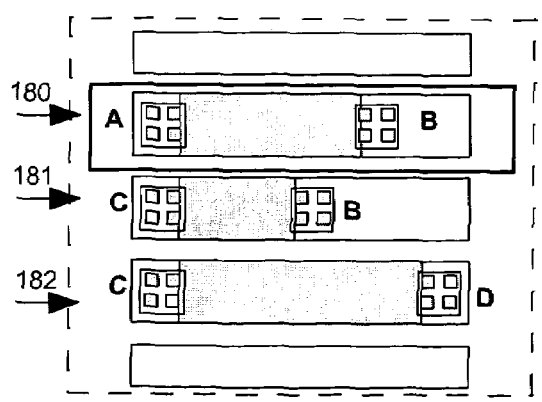
Figure 60:
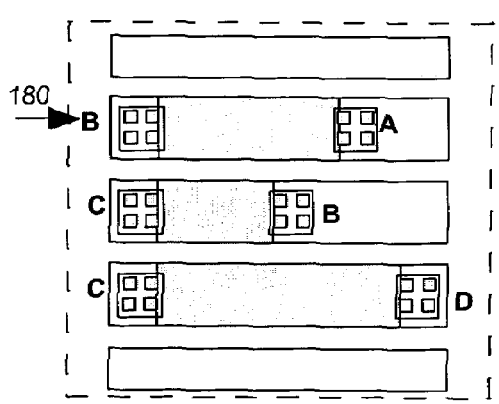

FIGS. 59 and 60 illustrate the exchange nodes function 117 of FIG. 36. In the layout the segment contacts are connected to nets formed on one or more other layers of the IC, and the layout for a resistor specifies the net to which each segment end is to be interconnected. For example the contacts of segment 180 of the resistor layout of FIG. 59 are specified as being connected to nets A and B, the contacts of segment 181 are to be connected to nets C and B, and the contacts of segment 182 are to be connected to nets C and D. When the user selects, for example, segment 180 of FIG. 59, and then selects an exchange node function from a mouse menu, the device editor swaps the A and B net connections on the selected segment 180 as illustrated in FIG. 60.

Figure 61:
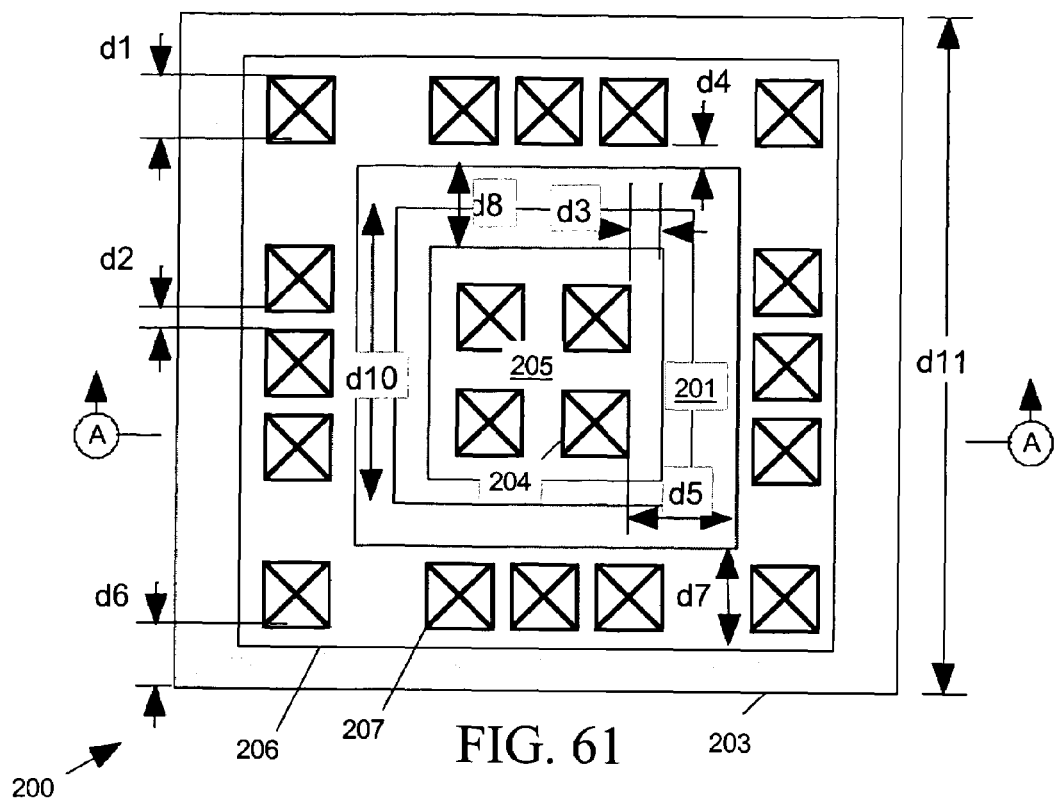
FIG. 61 is a plan view.
Figure 62:
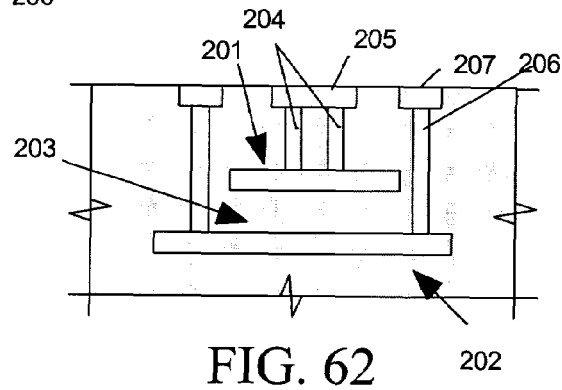
FIG. 62 is a sectional elevation view of a capacitor block layout that can be generated by the device generator of FIG. 6.

FIG. 61 is a plan view and FIG. 62 is a sectional elevation view of a capacitor device unit (or "capacitor block") 200 forming part of a unit-based device model 32 (FIG. 6) describing a capacitor. Device generator 30 of FIG. 6 can generate a passive device layout 31 for a capacitor that includes one or more capacitor blocks, with user-supplied option parameter values 44, device rules 45 and interactive editor 46 controlling many aspects of the capacitor.

Capacitor block 200 includes a "Cap1" layer 201 and a Cap2 layer 202 separated by a dielectric layer 203. A first set of vias form contacts 204 for connecting the Cap1 layer 201 to a structure 205 on a metal signal routing layer, and a second set of contacts 206 connect Cap2 layer 202 to a "guard ring" structure formed on the metal signal routing layer. The device model treats dimensions d1-d11 of FIG. 61 as variables, minimum values of which are defined by device rules 45 of FIG. 6.

Figure 63:
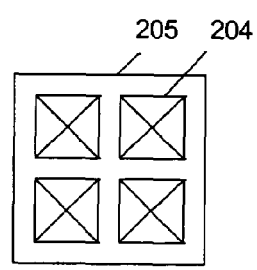
FIGS. 63 and 64 are plan views or portions of capacitor layouts that can be generated by the device generator of FIG. 6.
Figure 64:
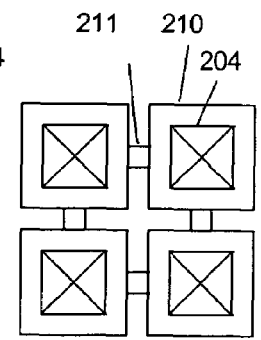
Figure 65:
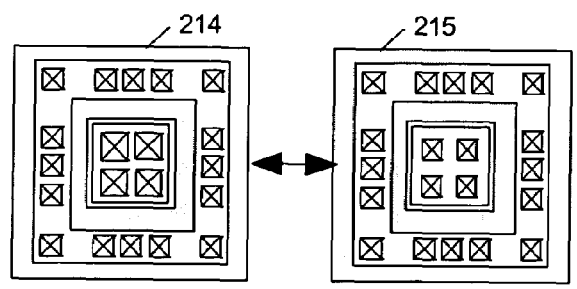
FIG. 65 is a plan view of two capacitor blocks that can be generated by the device generator of FIG. 6.
Figure 66:
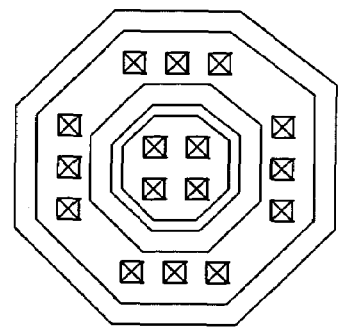
FIG. 66 is a plan view of an octagonal capacitor block that can be generated by the device generator of FIG. 6.
Figure 67:
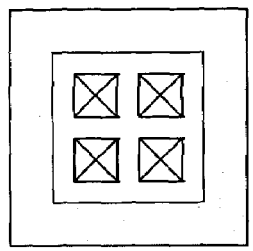
FIGS. 67-72 are plan views of example capacitor layouts generated by the device generator of FIG. 6.

FIGS. 63 and 64 illustrate alternative contact types. In the "maximum contact" type of FIG. 63, a rectangular metal structure 205 interconnects contacts 204, while in the "cross contact" type of FIG. 64 contacts 204 terminate on separate pads 210 interconnected by conductive strips 211 on the metal layer. Device rules 45 of FIG. 6 control the width of strips 211, the spacing between each contact 204 and the outer edge of pads 210, the center-to-center distance between pads 204 as illustrated in FIG. 64, and the spacing between separate capacitor block instances 214 and 215, as illustrated in FIG. 65. Capacitor blocks may be square, as illustrated in FIG. 61 or octagonal as illustrated in FIG. 66. When a ground plane of the IC is to act as the bottom plate 203 of the capacitor, the guard ring 207 and contacts 206 can be omitted as illustrated in FIG. 67.

Figure 70:
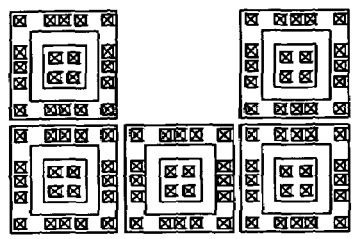
Figure 71:
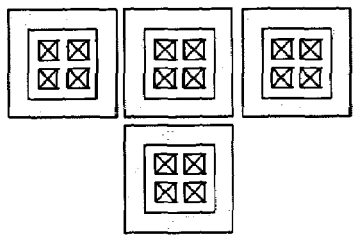
Figure 72:
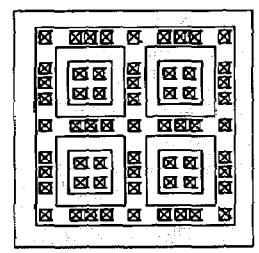

User-supplied option parameter values 44 of FIG. 6, provided through a GUI form, control many characteristics of the capacitor layout such as whether capacitor blocks are to be square as in FIG. 61 or octagonal as in FIG. 66, either the dimensions of upper plate 201 or the capacitance of each capacitor block. The user supplied option parameter values 44 can also specify the number of capacitor blocks to be included in the capacitor and the manner in which they are to be arranged. The capacitor blocks may be arranged in any of the shapes illustrated in FIGS. 68-71, including a rectangular shape as in FIG. 68, an "L" shape as in FIG. 70, a "U" shape as in FIG. 70 or a "T" shape as in FIG. 71. The user may also specify whether the bottom plates of the separate capacitor blocks are to be merged as illustrated in FIG. 72.

Figure 73:
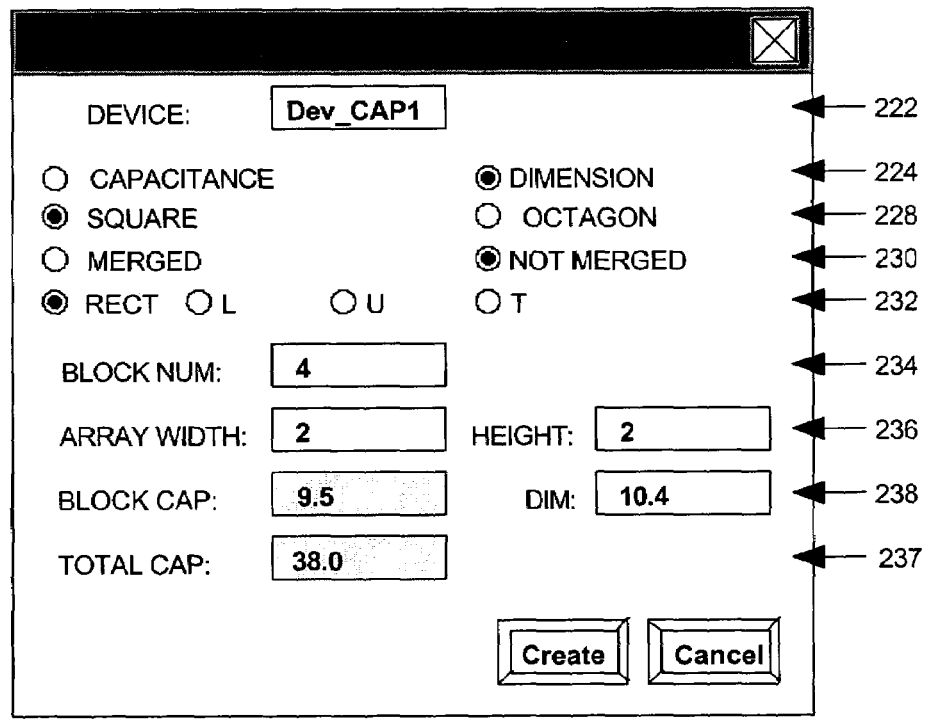
FIG. 73 depicts an example GUI form employed by the device generator of FIG. 6.

FIG. 73 illustrates a GUI form 220 that device generator 30 uses to obtain option parameter values from the user for specifying characteristics of a capacitor. A text box 222 allows the user to select a type for the capacitor. A pair of push buttons 224 enable the user to indicate whether the user wants to specify the capacitance or length/width dimension of the capacitor blocks that are to form the capacitor. Push buttons 228 and 230 allow the user to specify whether the capacitor blocks are to be square or octagonal, and whether they are to be merged. Pushbuttons 232 let the user specify whether the capacitor blocks are to be arranged in a rectangle, "L", "U", or "T" shape as illustrated in FIGS. 68-71. A text box 234 allows the user to enter the number of capacitor blocks that are to form the capacitor, text boxes 236 indicate width and height dimensions (in number of blocks) of the array of blocks that are to form the capacitor, text boxes 238 indicate the capacitance and side length/width dimensions of each capacitor block. Text box 237 indicates the total capacitance of the capacitor as the product of the specified number of capacitor blocks and the block capacitance.

When the user indicates by push buttons 224 that capacitor block dimensions are to be user-specified, device generator 30 allows the user to enter the capacitor dimension in one of text boxes 238, computes the capacitance of each block based on a formula provided by device rules 45 of FIG. 6, and enters the capacitance in the other text box 238. It also computes the total capacitance of the capacitor and enters it in text box 237. When the user sets push buttons 224 to indicate the user wants to specify block capacitance rather than block dimensions, device generator 30 allows the user to enter block capacitance in one of text boxes 238, computes the necessary block dimensions to achieve the desired block capacitance, and enters the result into the other of text boxes 238.

Figure 68:
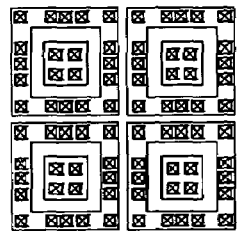
Figure 69:
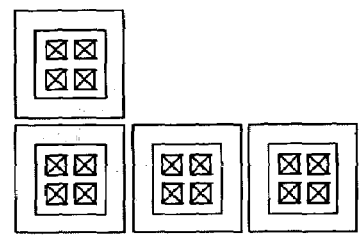

In the example of FIG. 73, the user has specified a capacitor having the layout of FIG. 68. If the user had selected the merged option of push buttons 230, the capacitor layout would look like FIG. 72. If the user had selected the "L" or "T" option of push buttons 232, the capacitor layout would look like that of FIG. 69 or 71. The "U" option would also result in a capacitor layout looking like FIG. 70 instead of FIG. 70 because the user would not have specified a sufficient number of block to create a U-shaped capacitor. However if the user had indicated the capacitor is to include five blocks instead of four, and had selected the "U" shape option, device generator 30 of FIG. 6 would have produced the capacitor layout of FIG. 70. If the user had indicated the capacitor is to include five blocks and is to be rectangular, device generator 30 would have generated a layout similar to that shown in FIG. 68, but with an extra block placed next to one of the four blocks in the figure. The position of the extra block would depend on the dimensions of the array specified in text boxes 236. For a five-block array, the user might specify in text boxes 236 an array width of 2 and height of 3, and in such case the device generator would place the extra block above one of the two blocks on the top of the rectangular array of FIG. 68. The user must specify array dimensions in blocks 236 at least large enough to accommodate the number of block specified in text box 234. After the user presses the "Create" button on GUI form 220, device generator 30 of FIG. 6 generates the capacitor layout 31 and produces a display 50 representing the layout. The device generator 30 tries to make the layout as close as possible to the desired shape, specified in blocks 232, given the number of capacitor blocks chosen in text box 234. The user may then employ interactive editor 46 to change various aspects of the capacitor layout.

Figure 74:
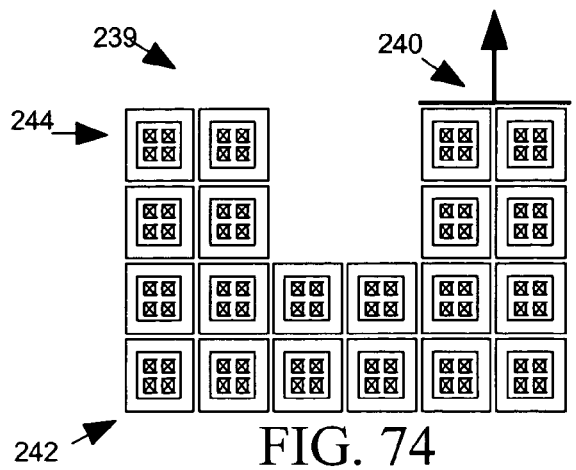
Figure 75:
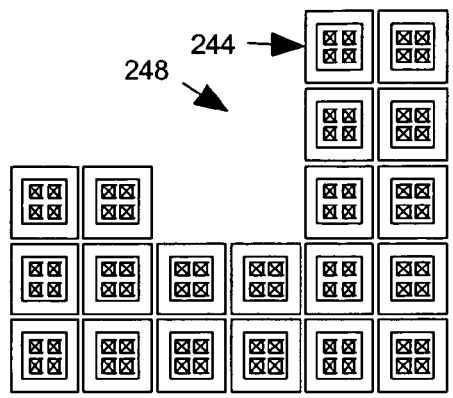

FIG. 74 illustrates a display of a capacitor layout where the user has specified that a U-shaped capacitor is to include 20 blocks. Referring to FIG. 36, the reshape function 110 of interactive editor 46 allows the user to alter the arrangement of capacitor blocks forming the capacitor. For example when the user uses a mouse to select a top left edge 239 of the capacitor 242 and then uses the mouse to drag the top right edge 240 upward, device generator 30 modifies the layout as shown in FIG. 75, by removing a pair of blocks 244 from the left leg 246 of capacitor 242 and adding them to right leg 248.

Figure 76:
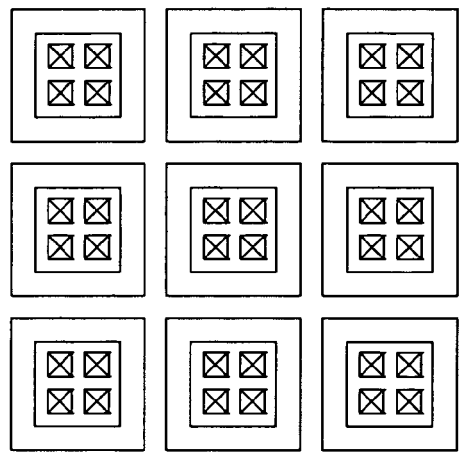
Figure 77:
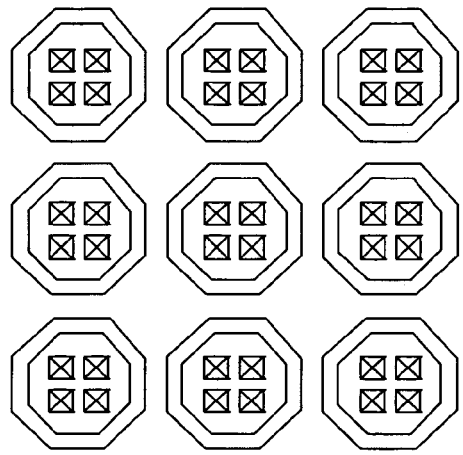
Figure 78:
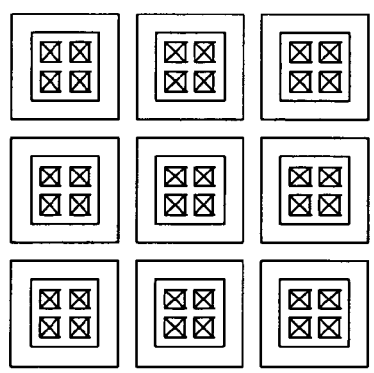
Figure 79:
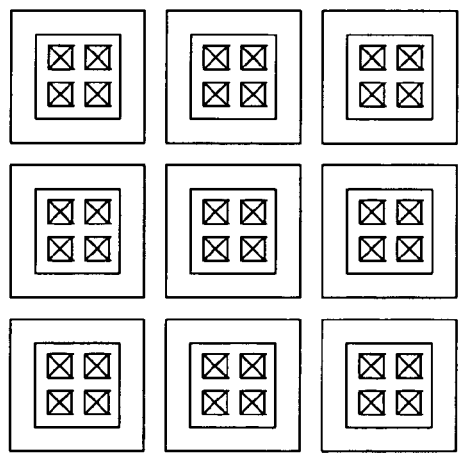

The user invokes the "modify" function 111 of FIG. 36 by selecting a capacitor layout and then selecting a modify command from a menu. This tells device generator 30 to redisplay the GUI form for that capacitor so that the user can alter any of its option parameter values. For example, FIG. 76 shows a capacitor layout wherein the user specified that the capacitor blocks are to be rectangular. Using the interactive editor's modify function 111, the user can specify the capacitor blocks as being octagonal, and the device generator will alter the capacitor layout accordingly, as illustrated in FIG. 77. The user could, for example, employ the modify function to alter the specified dimensions or capacitance of a capacitor. Thus if the user had specified a capacitor in which specified block dimensions are as illustrated in FIG. 76, the user could use the modify function to make block dimension smaller as illustrated in FIG. 78. A similar shrinking of block dimensions would occur if the user had originally specified a particular block capacitance to produce the layout of FIG. 76 and had then used the modify function to specify a reduced block capacitance. Device generator 30 would automatically regenerate the layout of FIG. 78. The user could also use the modify function to alter array dimensions and/or shapes, for example, from the 3×4 rectangular array of FIG. 80 to the 4×3 rectangular array of FIG. 81, or to the 4×4, L-shaped array of FIG. 82.

The "fold" function 115 of FIG. 36 enables the user to replace a single capacitor block as illustrated in FIG. 83 into a 2×2 array of four capacitor blocks as illustrated in FIG. 84 wherein each capacitor block of FIG. 84 has one fourth of the capacitance of the capacitor block of FIG. 83. The user invokes the fold function by selecting the capacitor block or blocks to be subject to the fold operation, and then selecting a fold command from a menu.

The "merge units" function 114 of FIG. 36 enables a user to merge a selected set of four smaller capacitor blocks into a single larger capacitor block having a capacitance equal to a sum of capacitances of the four smaller blocks. For example the user could merge the four small capacitor blocks of FIG. 84 into the single capacitor block of FIG. 83 by using a mouse to select the four smaller blocks and then selecting a merge menu command.

The split function 113 of FIG. 36 allows the user to split a single capacitor into two capacitors. For example, given a capacitor layout as illustrated in FIG. 85, when the user uses a mouse to draw a line 250 on the layout display between any two columns or rows of a capacitor block array, and then selects a "split" command from a menu, the device layout generator splits the single capacitor into two capacitors along the line, as illustrated in FIG. 86. When the user draws a line 252 in a capacitor layout as illustrated in FIG. 87 and then selects the split command, the device layout generator splits the capacitor into two capacitors as illustrated in FIG. 88.

The merge function 112 of FIG. 36 allows the user to merge two capacitors into one. For example as illustrated in FIG. 89, when the user employs a mouse to select edges 256 and 258 of capacitor blocks of two separate capacitors 260 and 262, and then selects a merge command from a menu, the device generator merges the two capacitors as illustrated in FIG. 90 to form a single capacitor 264 by joining them along capacitor block edges 256 and 258.

FIGS. 91 and 92 illustrate a merge operation where the user has selected edges 270 and 272 of blocks of two capacitors 274 and 276 of FIG. 91 and then selected the merge command to produce a single merged capacitor 278. FIGS. 93 and 94 illustrate a merge operation where the user has selected edges 280 and 282 of blocks of two capacitors 284 and 286 of FIG. 92 and then selected the merge command to produce a single merged capacitor 288.

By forming a passive device layout from instances of device units, the method of the present invention enables a user to easily and flexibly adjust the shape and other characteristics of a passive device layout by using the graphical interface to reposition the device unit instances and by altering characteristics of the device unit instances.

While the invention has been illustrated above in connection with generating capacitor and resistor layouts, it may also be used in connection with generating inductor layouts of various sizes and shapes formed by sets of unit inductor devices. Thus while the forgoing specification and the drawings depict exemplary embodiments of the best mode(s) of practicing the invention, and elements or steps of the depicted best mode(s) exemplify the elements or steps of the invention as recited in the appended claims, the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. Computer-readable media containing program instructions which, when read and executed by a computer, cause the computer to carry out a method for generating layouts for passive devices to be formed within an integrated circuit (IC), wherein the method comprises, for each passive device, the steps of:
   a. receiving as input a layout model of the passive device including a description of the passive device layout as being formed by a variable number of instances of a device unit, wherein the number and relative positions of the device unit instances forming the passive device and characteristics of an internal layout of each device unit instance are variable functions of input parameter values;
   b. receiving the parameter values as input;
   c. generating a layout for the passive device in accordance with the description included in the layout model, wherein the number of instances of the device unit forming the passive devices, their relative positions and the characteristics of the internal layout of each device unit instance are controlled in accordance with the variable functions included in the layout model and the received parameter values; and
   d. displaying a graphical representation of the passive device layout generated at step c.

2. The computer-readable media in accordance with claim 1 wherein the method further comprises the steps of
   e. providing a graphical user interface enabling a user to alter the displayed graphical representation of the passive device layout; and
   f. altering the passive device layout when the user alters its displayed graphical representation to render the passive device layout consistent with its graphical representation.

3. The computer-readable media in accordance with claim 1 wherein parameter values received at step b select spacing between the device unit instances within the passive device layout.

4. The computer-readable media in accordance with claim 1 wherein one portion of the parameter values received at step b are functions of IC semiconductor technology design rules.

5. The computer-readable media in accordance with claim 4 wherein a user supplies another portion of the parameter values received at step b.

6. The computer-readable media in accordance with claim 1 wherein the internal layout of each device unit instance included in the passive device layout generated at step c includes a plurality of objects.

7. The computer-readable media in accordance with claim 6 wherein the variable functions and received parameter values control spacing between at least two of the objects.

8. The computer-readable media in accordance with claim 6, wherein the variable functions and received parameter values control at least one dimension of at least one of the objects.

9. The computer-readable media in accordance with claim 1 wherein one portion of the received parameter values are functions of IC semiconductor technology design rules specifying minimum spacing between structures within a semiconductor, and that portion of the received parameter values influences spacing between objects forming the device unit instances.

10. The computer-readable media in accordance with claim 9 wherein a user supplies another portion of the received parameter values that influence the number of device unit instances included in the passive device.

11. The computer-readable media in accordance with claim 10 wherein said another portion of the received parameter values also influence characteristics of the internal layouts of the device unit instances.

12. The computer-readable media in accordance with claim 1
   wherein each passive device is a resistor such that each passive device layout is a resistor layout,
   wherein each device unit instance forming the resistor is a resistor segment comprising:
      a body formed by resistive material within the IC, and
      a plurality of conductive contact structures connected to the body, and
   wherein conductors interconnect contact structures of the device unit instances.

13. The computer-readable media in accordance with claim 12 wherein a dimension of the body of each resistor segment is independently controlled by the received parameter values.

14. The computer-readable media in accordance with claim 12 wherein a number of conductive contact structures connected to the body of each resistor segment is a variable function of at least one of the received parameter values.

15. The computer-readable media in accordance with claim 12
   wherein the received parameter values specify a resistance of each resistor segment, wherein the resistance of each resistor segment is a function of a dimension of the body of the resistor segment, and wherein that dimension of the body of each resistor segment is selected at step c so that the resistor segment has the resistance specified by the received parameter values.

16. The computer-readable media in accordance with claim 12 wherein the method further comprises the steps of
   e. providing a graphical interface enabling a user to alter the displayed graphical representation of each resistor layout; and
   f. altering each resistor layout when the user alters its displayed graphical representation, so that the resistor layout is consistent with its graphical representation.

17. The computer-readable media in accordance with claim 16, wherein the graphical interface enables the user to alter the displayed graphical representation of a displayed resistor layout by altering a position of a resistor segment instance within that resistor layout.

18. The computer-readable media in accordance with claim 16, wherein the graphical interface enables the user to alter the displayed graphical representation of the displayed resistor layout by splitting the resistor layout representation into two separate new resistor layout representations, each including a separate subset of ifs resistor segment instances, wherein the resistor layout is altered at step f by replacing it with two resistor layouts, each consistent with a separate one of the two resistor new layout representations.

19. The computer-readable media in accordance with claim 16, wherein the graphical interface enables the user to alter the displayed graphical representation of the displayed resistor layout formed by a plurality of resistor segments, by replacing representations of at least two of the resistor segments with a representation of a single resistor segment having a resistance equal to a sum of resistances of the plurality of resistor segments.

20. The computer-readable media in accordance with claim 16, wherein the graphical interface enables the user to alter the displayed graphical representation of the resistor layout by replacing a representation of a single resistor segment of the resistor layout with representations of a plurality of resistor segments, wherein the single resistor segment has a resistance equal to a sum of resistances of the plurality of resistor segments.

21. The computer-readable media in accordance with claim 16, wherein the graphical interface enables the user to replace concurrently displayed representations of layouts of a plurality of resistors with a representation of a layout of a single resistor having a resistance equal to a sum of resistances of the plurality of resistors.

22. The computer-readable media in accordance with claim 16 wherein the graphical interface enables the user to independently alter characteristics of the internal layout of any individual resistor segment by altering parameter values controlling those characteristics.

23. The computer-readable media in accordance with claim 16 wherein the graphical interface enables the user to select representations of two resistor segments forming a resistor and specify that their positions will be swapped.

24. The computer-readable media in accordance with claim 16 wherein the graphical interface enables the user to alter a manner in which segments are interconnected.

25. The computer-readable media in accordance with claim 1
   wherein each passive device is a capacitor such that each passive device layout is a capacitor layout,
   wherein the layout model describes the device unit as a capacitor block comprising:
      a first conductive plate formed within the IC, and
      a first conductive contact structure formed within the IC and connected to the plate, wherein conductors interconnect the first conductive contract structures of all instances of the capacitor block forming the capacitor.

26. The computer-readable media in accordance with claim 25
   wherein the device model also describes the capacitor block as optionally comprising:
      a second conductive plate formed within the IC, and
      a second conductive contact structure, wherein conductors interconnect the second contact structures of all instances of the capacitor block forming the capacitor.

27. The computer-readable media in accordance with claim 26 wherein the received parameter values control whether instances of the capacitor blocks forming a capacitor include the second conductive plate and the second conductive contract structure.

28. The computer-readable media in accordance with claim 25 wherein the received parameter values control whether the first conductive plates of all capacitor block instances forming a capacitor contact one another or are spaced apart.

29. The computer-readable media in accordance with claim 25 wherein the received parameters control a dimension of the first conductive plate of each capacitor block instance.

30. The computer-readable media in accordance with claim 25
   wherein the received parameter values specify a capacitance of the capacitor block,
   wherein the capacitance of the capacitor block is a function of a dimension of the first conductive plate, and
   wherein that dimension of the first conductive plate is selected at step c so that each instance of the capacitor block forming capacitor has the capacitance specified by the received parameter values.

31. The computer-readable media in accordance with claim 25 wherein the received parameter values control a shape of the capacitor block.

32. The computer-readable media in accordance with claim 25 wherein the method further comprises the steps of
   e. providing a graphical interface enabling a user to alter the displayed graphical representation of each capacitor layout; and
   f. altering each capacitor layout when the user alters its displayed graphical representation, so that capacitor layout is consistent with its graphical representation.

33. The computer-readable media in accordance with claim 32, wherein the graphical interface enables the user to alter the displayed graphical representation of any displayed capacitor layout at by altering a position of a capacitor block instance within that capacitor layout.

34. The computer-readable media in accordance with claim 32, wherein the graphical interface enables the user to alter the displayed graphical representation of any capacitor layout at by splitting the capacitor layout representation into two new separate capacitor layout representations, each including a separate subset of its capacitor block instances, wherein the capacitor layout is altered at step f by replacing it with two capacitor layouts, each consistent with a separate one of the two new capacitor layout representations.

35. The computer-readable media in accordance with claim 32, wherein the graphical interface enables the user to alter a shape of each capacitor block instance.

36. The computer-readable media in accordance with claim 32, wherein the graphical interface enables the user to replace concurrently displayed representations of layouts of a plurality of capacitors with a representation of a layout of a single capacitor having a capacitance equal to a sum of capacitances of the plurality of capacitors.

37. The computer-readable media in accordance with claim 1, wherein the variable number of instances of the device unit is at least two.

* * * * *